(12) United States Patent
Nakanishi et al.

(10) Patent No.: US 9,236,875 B2
(45) Date of Patent: Jan. 12, 2016

(54) D/A CONVERTER

(71) Applicant: ASAHI KASEI MICRODEVICES CORPORATION, Tokyo (JP)

(72) Inventors: Yutaka Nakanishi, Tokyo (JP); Junya Nakanishi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/432,292

(22) PCT Filed: Oct. 11, 2013

(86) PCT No.: PCT/JP2013/006102
§ 371 (c)(1),
(2) Date: Mar. 30, 2015

(87) PCT Pub. No.: WO2014/061253
PCT Pub. Date: Apr. 24, 2014

(65) Prior Publication Data
US 2015/0263743 A1    Sep. 17, 2015

(30) Foreign Application Priority Data

Oct. 19, 2012 (JP) ................................. 2012-231514
Nov. 7, 2012 (JP) ................................. 2012-245287

(51) Int. Cl.
*H03M 1/66* (2006.01)
*H03M 1/06* (2006.01)
*H03M 1/80* (2006.01)

(52) U.S. Cl.
CPC ............ *H03M 1/0626* (2013.01); *H03M 1/662* (2013.01); *H03M 1/802* (2013.01); *H03M 1/667* (2013.01)

(58) Field of Classification Search
CPC ..... H03M 1/804; H03M 1/442; H03M 3/464; H03M 1/0607; H03M 3/372; H03M 1/0624; H03M 1/66; H03M 1/0663; H03M 1/0863; H03M 1/46; H03M 3/356

USPC .......................................... 341/144, 150, 172
See application file for complete search history.

(56) References Cited

U.S. PATENT DOCUMENTS 5,818,377 A * 10/1998 Wieser ................ H03M 1/0665
341/143
6,271,783 B1 * 8/2001 Cairns .................. G09G 3/2011
341/144

(Continued)

FOREIGN PATENT DOCUMENTS

JP     S62-006536 A    1/1987
JP     H05-235761 A    9/1993

(Continued)

OTHER PUBLICATIONS

International Preliminary Report on Patentability dated Apr. 21, 2015, for the corresponding International application No. PCT/JP2013/006102.

(Continued)

*Primary Examiner* — Linh Nguyen
(74) *Attorney, Agent, or Firm* — Morgan, Lewis & Bockius LLP

(57) ABSTRACT

To provide a D/A converter including a sampling circuit capable of suppressing a high-frequency component in an input signal without obstructing downsizing of electronic equipment. A D/A converter includes a first capacitative element unit including plural sampling capacitors, a second capacitative element unit including plural sampling capacitors, a first switch unit including the plural switches configured to store charges in the plural sampling capacitors of the first capacitative element unit and to transfer the charge, and a second switch unit including the plural switches configured to store charges in the plural sampling capacitors of the second capacitative element unit and to transfer the charge. The first and the second switch units operate alternately.

13 Claims, 26 Drawing Sheets

(56) References Cited

U.S. PATENT DOCUMENTS

| | | | |
|---|---|---|---|
| 6,437,720 B1* | 8/2002 | Yin | H03M 1/0663 341/144 |
| 7,236,116 B2* | 6/2007 | Hong | H03M 3/378 341/120 |
| 7,663,525 B2* | 2/2010 | Tsai | H03M 1/0682 341/144 |
| 8,917,196 B2* | 12/2014 | Nakanishi et al. | 341/122 |
| 8,970,415 B2* | 3/2015 | Quiquempoix | H03M 1/0665 341/143 |
| 2003/0179122 A1* | 9/2003 | Yamamura | H03M 3/502 341/150 |
| 2003/0201923 A1* | 10/2003 | Uno | G06G 7/14 341/150 |
| 2004/0004565 A1 | 1/2004 | Melanson | |
| 2005/0035891 A1* | 2/2005 | Pirjaberi | H03M 1/82 341/150 |
| 2010/0207795 A1 | 8/2010 | Waki et al. | |
| 2012/0112944 A1* | 5/2012 | Chang | H03M 1/0653 341/144 |
| 2014/0097977 A1* | 4/2014 | Nakamoto | H03M 1/06 341/150 |

FOREIGN PATENT DOCUMENTS

| | | |
|---|---|---|
| JP | 2002-217736 A | 8/2002 |
| JP | 2003-143008 A | 5/2003 |
| JP | 2005-532732 A | 10/2005 |
| JP | 2005532732 A | 10/2005 |
| JP | 2010-193089 A | 9/2010 |

OTHER PUBLICATIONS

International Search Report dated Jan. 7, 2014, for International application No. PCT/JP2013/006102.

* cited by examiner

FIG. 2
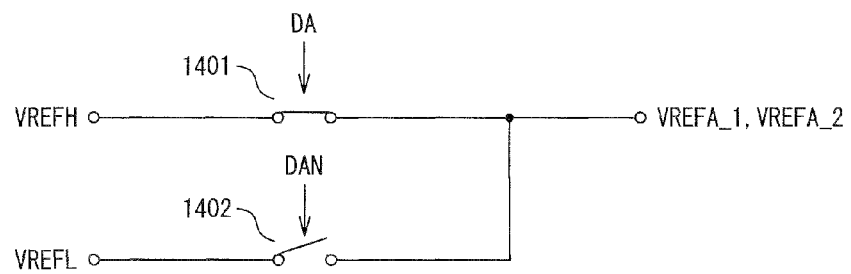
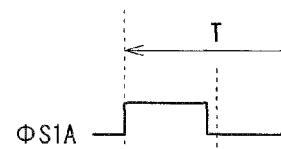
FIG. 3A  ΦS1A
FIG. 3B  ΦS2A
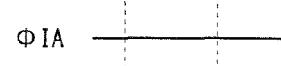
FIG. 3C  ΦIA
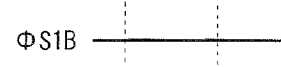
FIG. 3D  ΦS1B
FIG. 3E  ΦS2B
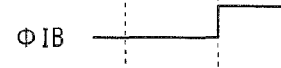
FIG. 3F  ΦIB
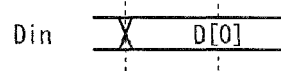
FIG. 3G  Din
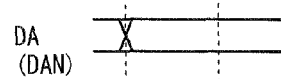
FIG. 3H  DA (DAN)
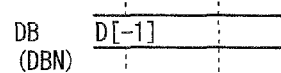
FIG. 3I  DB (DBN)
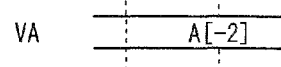
FIG. 3J  VA
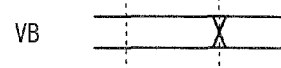
FIG. 3K  VB
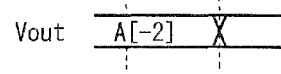
FIG. 3L  Vout FIG. 27A ΦS
FIG. 27B ΦI
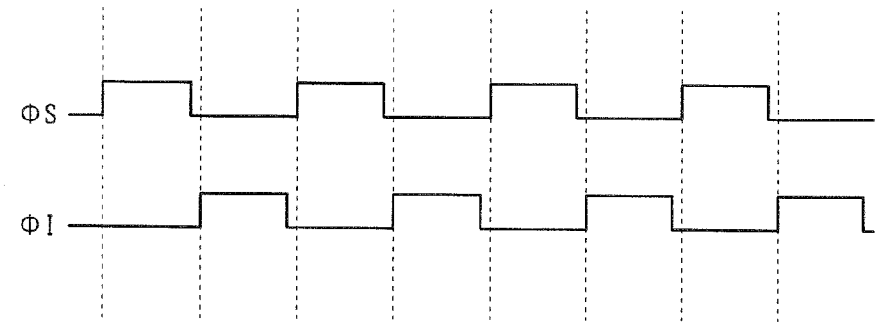
FIG. 28
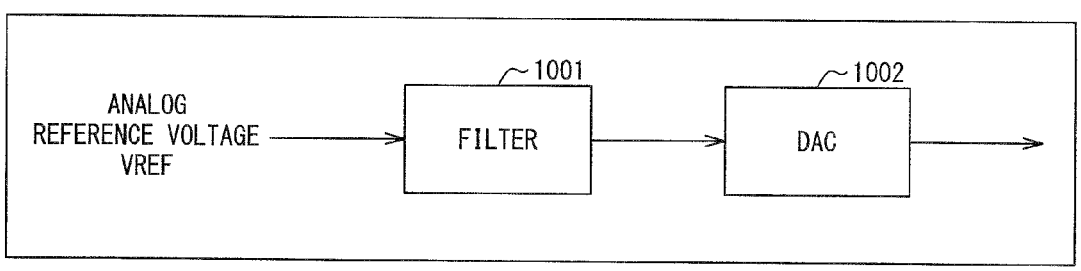

D/A CONVERTER

TECHNICAL FIELD

This disclosure relates to a D/A converter, more specifically, to a D/A converter including a sampling circuit capable of suppressing a high-frequency component in an input signal without obstructing downsizing of electronic equipment.

BACKGROUND ART

Recently, demands of downsizing of electronic equipment have increased. Electronic components mounted on the electronic equipment are downsized and disposed in more proximity to each other.

When the electronic components are disposed in proximity to each other, the noise produced in the electronic component is transmitted to another electronic component directly, or via a mounting substrate or a wiring, and the normal operation of the other electronic component may be obstructed. For this reason, recent electronic equipment is required to suppress the influence of the noise (hereinafter may be referred to as "noise countermeasure"), as well as to be downsized.

In order to prevent the noise produced in the electronic component from affecting the other electronic component, generally, a filter may be inserted in a noise transmission path to suppress the noise component.

Additionally, the electronic components mounted on the electronic equipment include a D/A converter. The D/A converter is an electronic component widely utilized in an audio function of the electronic equipment or the like, and needs the noise countermeasure especially.

As a conventional noise countermeasure for the D/A converter, for example, the invention of a D/A conversion circuit described in PTL 1 and the like are known. The D/A conversion circuit described in PTL 1 relates to a digital-analog conversion circuit having a high-speed response performance and a low noise performance. The D/A conversion circuit described in PTL 1 includes a reference voltage source circuit, a digital input processing circuit, an weighted current source circuit, and a current controlling switch circuit. Furthermore, at least one of a current buffer circuit and a filter circuit is provided between the weighted current source circuit and the current controlling switch circuit.

FIG. 26 is a circuit diagram illustrating a conventional D/A converter. A sampling circuit 4 includes a sampling capacitor 905 and switches 901, 902, 903, and 904. The switch 901, the sampling capacitor 905 and the switch 902 are connected to one another in series. The switch 903, the sampling capacitor 905 and the switch 904 are connected to one another in series.

The other end of the switch 901 is connected to an input terminal 111 of an analog input signal VREF. The other end of the switch 902 is connected to a terminal 113 to which an analog reference voltage Vcom is supplied. The other end of the switch 904 as an output terminal of the sampling circuit 4 is connected to one end of an integral capacity element 106 and an inverted input terminal of an operational amplifier 107.

The integral capacity element 106 is connected between the inverted input terminal of the operational amplifier 107 and an output terminal. An output terminal of the operational amplifier 107 is connected to the output terminal 112 of the D/A converter 3. An output signal Vout is output from the output terminal 112. A non-inverted input terminal of the operational amplifier 107 is connected to a terminal 114 to which an analog reference voltage Vcom is supplied.

Respective switches mentioned above are driven by clock signals ΦS and ΦI supplied from a controlling circuit 959, and perform on/off operation.

The analog input signal VREF is input from the input terminal 111 to the D/A converter including the above-mentioned configuration. The analog input signal VREF is sampled by the switches 901 and 902. A charge is stored in the sampling capacitor 905 by the sampling.

The charge stored in the sampling capacitor 905 is input to the inverted input terminal of the operational amplifier 107 in accordance with the switching of the switches 901, 902, 903 and 904. The operational amplifier 107 receives the reference voltage signal Vcom at the non-inverted input terminal and outputs the output signal Vout.

FIGS. 27A and 27B are timing charts of clock signals supplied to a conventional D/A converter. FIGS. 27A and 27B illustrate operating timings of the clock signals supplied to the respective switches illustrated in FIG. 26.

The switch 901 and the switch 902 are driven by the clock signal ΦS, and the switch 903 and the switch 904 are driven by the clock signal ΦI.

It is to be noted that FIG. 27A illustrates the clock signal ΦS, and the FIG. 27B illustrates the clock signal ΦI.

As illustrated in FIGS. 27A and 27B, the clock signal ΦS and the clock signal ΦI are non-overlap clock signals, which are not at an H level at the same time.

The sampling timing of the D/A converter illustrated in FIG. 26 comes only when the sampling capacitor 905 performs the sampling operation. Therefore, it is not possible to obtain a Finite Impulse Response (FIR) filter characteristic.

FIG. 28 is a block diagram illustrating filtering in the conventional D/A converter. The conventional filtering uses a D/A converter 1002 and an analog prefilter 1001 to obtain an effect of high-frequency attenuation.

CITATION LIST

Patent Literature

PTL1: JP 2002-217736 A

SUMMARY OF INVENTION

Brief Description of Drawings

FIG. 2 is a circuit diagram illustrating an example of a switch circuit connected to input terminals to which analog input signals VREFA_1, VREFA_2, VREFB_1, VREFB_2 illustrated in FIG. 1 are input;

FIGS. 3A to 3L are timing charts of clock signals input to and output from a D/A converter illustrated in FIG. 1;

FIGS. 27A and 27B are timing charts of clock signals supplied to a conventional D/A converter; and FIG. 28 is a block diagram illustrating filtering in a conventional D/A converter.

DESCRIPTION OF EMBODIMENTS

Figure 1:
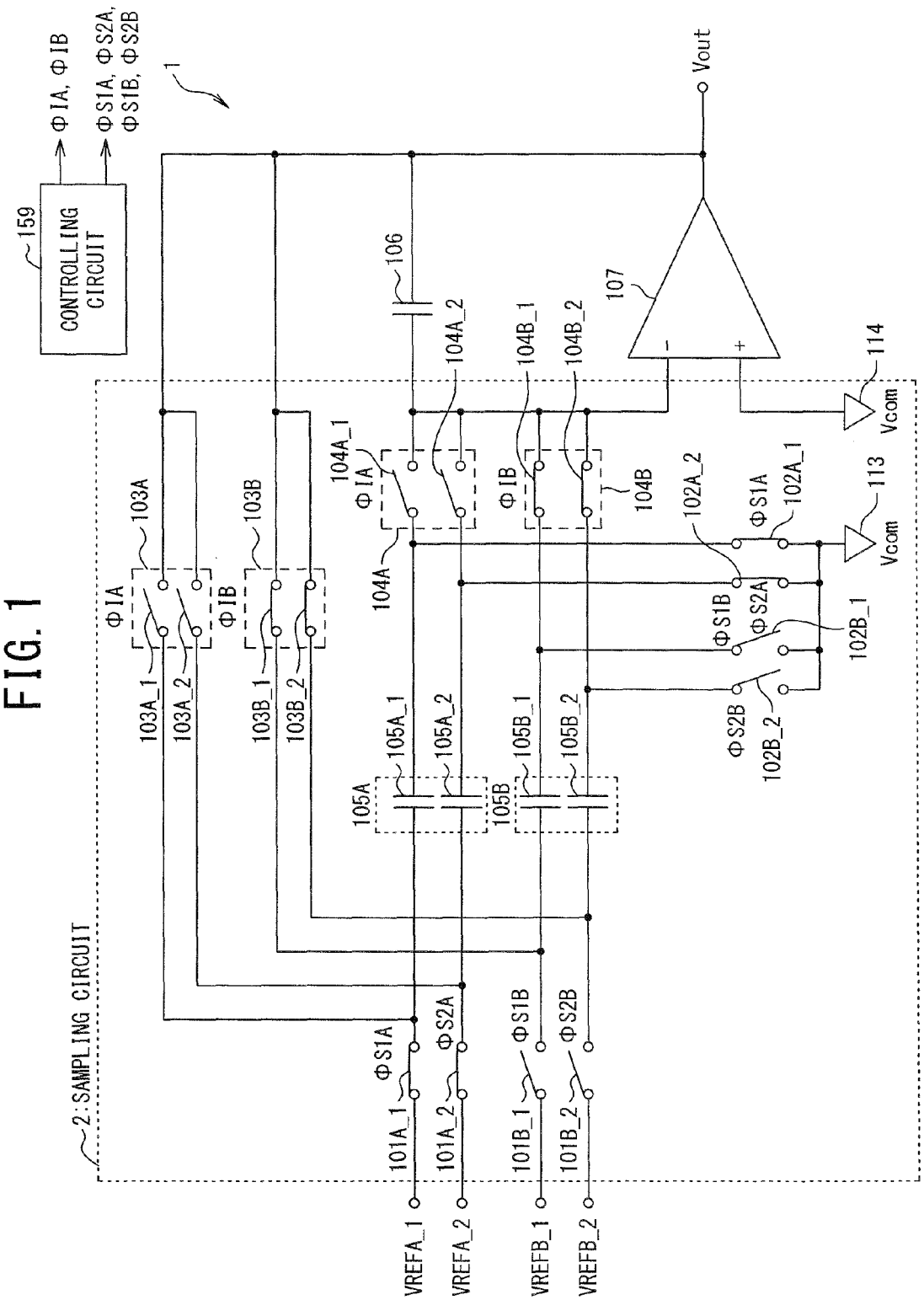
FIG. 1 is a circuit diagram illustrating a D/A converter according to the first embodiment of the present invention.

Inserting the filter in the noise transmission path needs the filter circuit. Thus, such an approach cannot contribute to the downsizing of the electronic equipment. Furthermore, the analog prefilter 1001 cannot reduce the radiation noise due to an inrush current produced in connection with the sampling operation of the D/A converter 1002. For this reason, the configuration illustrated in FIG. 28 needs a further circuit element or the like for the radiation noise countermeasure, and thus cannot contribute to the downsizing of the electronic equipment.

The present disclosure has been made in view of the above problem, and has an object to provide a D/A converter including a sampling circuit capable of suppressing a high-frequency component in an input signal and of reducing radiation noise due to an inrush current without obstructing downsizing of electronic equipment.

In order to achieve the above mentioned object, according to one aspect of the present disclosure, there is provided a D/A converter including a first capacitative element unit (a capacitative element unit 105A illustrated in FIG. 1, for example) including a plurality of capacitative elements (sampling capacitors 105A_1, 105A_2 illustrated in FIG. 1, for example) configured to store a first charge depending on a reference voltage corresponding to a first digital code (DA (DAN) illustrated in FIG. 2, for example), a first switching element unit (a switch unit 103A, 104A illustrated in FIG. 1, for example) including a plurality of switching elements (switches 103A_1, 103A_2, 104A_1, and 104A_2 illustrated in FIG. 1, for example) configured to store the first charge in the plurality of capacitative elements of the first capacitative element unit, respectively, and to transfer the first charge, a second capacitative element unit (a capacitative element unit 105B illustrated in FIG. 1, for example) including a plurality of capacitative elements (sampling capacitors 105B_1, 105B_2 illustrated in FIG. 1, for example) configured to store a second charge depending on a reference voltage corresponding to a second digital code (DB, DBN illustrated in FIG. 3, for example), and a second switching element unit (a switch unit 103B, 104B illustrated in FIG. 1, for example) including a plurality of switching elements (switches 103B_1, 103B_2, 104B_1, and 104B_2 illustrated in FIG. 1, for example) configured to store the second charge in the plurality of capacitative elements of the second capacitative element unit, respectively, and to transfer the second charge, an integral capacity element (an integral capacity element 106 illustrated in FIG. 1, for example) to which the first and the second charges stored in the first capacitative element unit and the second capacitative element are transferred, and an operational amplifier (an operational amplifier 107 illustrated in FIG. 1, for example) connected to the first switching element unit. The first switching element unit is configured to store the first charge in the plurality of capacitative elements of the first capacitative element unit in accordance with a plurality of clock signals (clock signals ΦS1A, ΦS2A illustrated in FIG. 3, for example) which are set such that sampling timings are different from each other. The second switching element unit is configured to store the second charge in the plurality of capacitative elements of the second capacitative element unit in accordance with a plurality of clock signals (clock signals ΦS1B, ΦS2B illustrated in FIG. 1, for example) which are set such that sampling timings are different from each other.

Furthermore, according to one aspect of the present disclosure, in the D/A converter according to above-mentioned aspect, the first switching element unit may be configured to store the first charge in the plurality of capacitative elements of the first capacitative element unit while the second switching element unit stops storing the second charge, and the second switching element unit may be configured to store the second charge in the plurality of capacitative elements of the second capacitative element unit while the first switching element unit stops storing the first charge.

Furthermore, according to one aspect of the present disclosure, in the D/A converter according to the above-mentioned aspects, the first switching element unit and the second switching element unit may be configured to operate alternately.

Furthermore, according to one aspect of the present disclosure, in the D/A converter according to the above-mentioned aspects, the first switching element unit and the second switching element unit may be configured to operate in turn.

Figure 17:
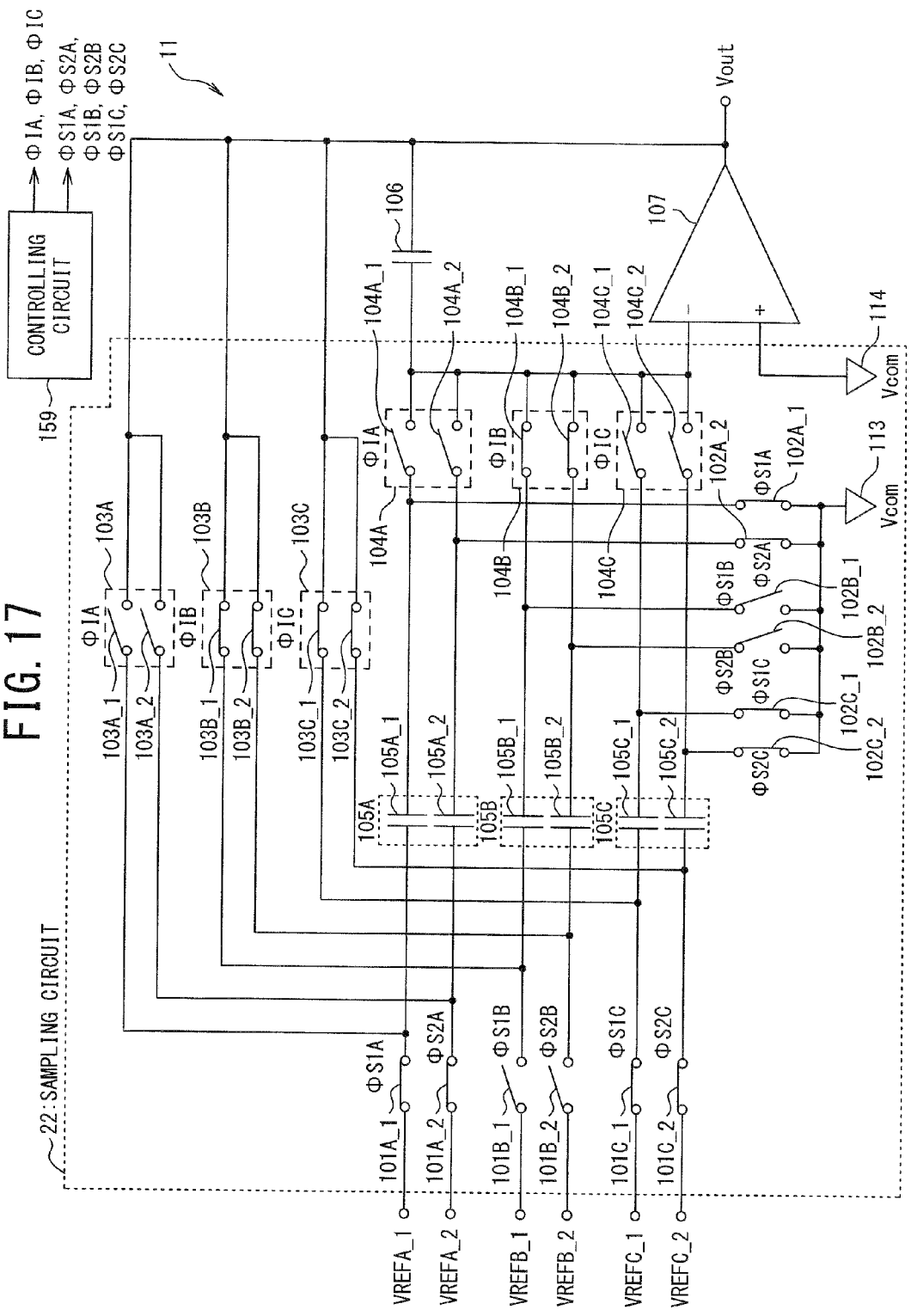
FIG. 17 is a circuit diagram illustrating a D/A converter according to the fourth embodiment of the present invention.
Figure 18:
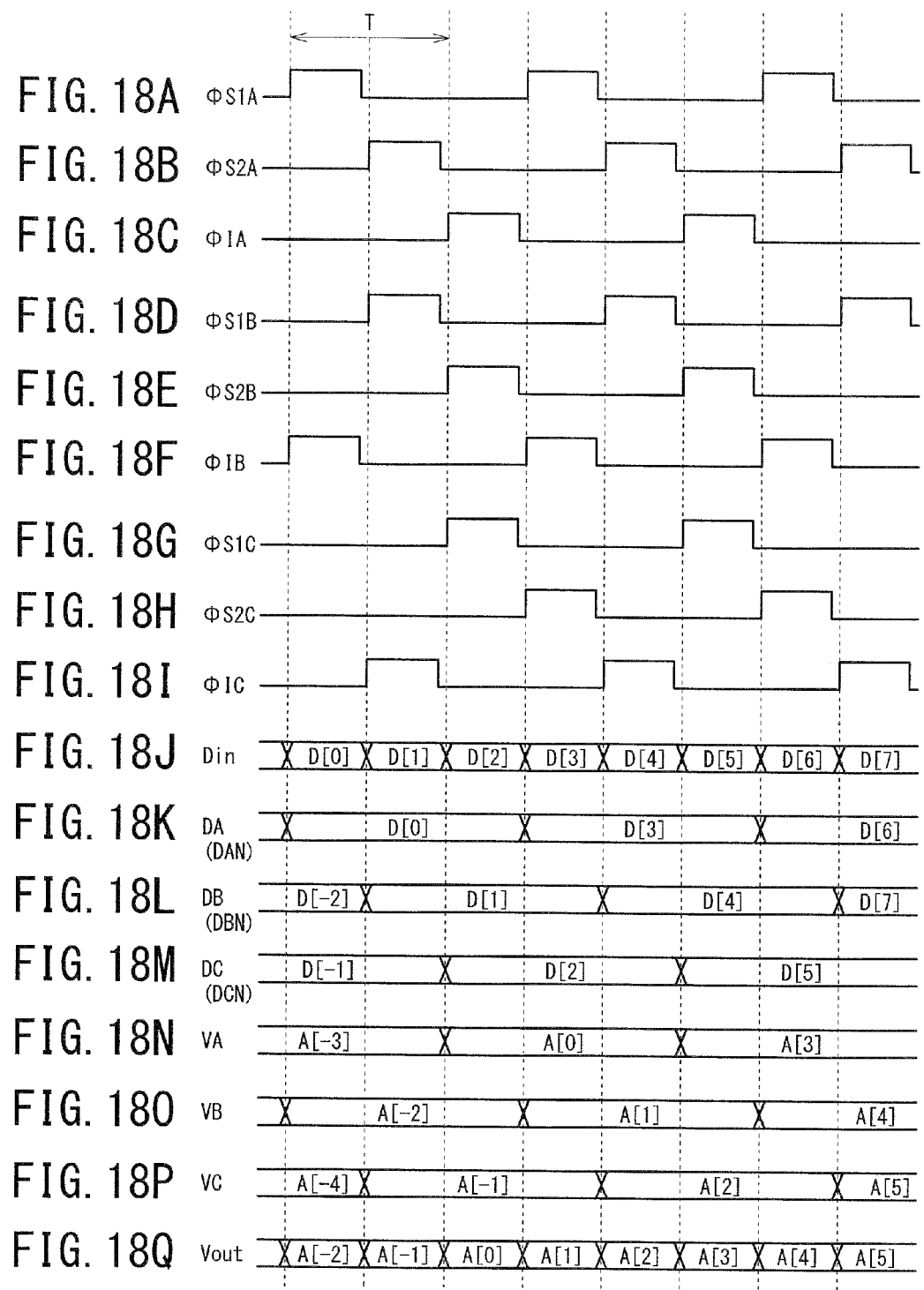
FIGS. 18A to 18Q are timing charts of clock signals input to and output from a D/A converter illustrated in FIG. 17.

Furthermore, according to one aspect of the present disclosure, the D/A converter according to the above-mentioned aspects may includes a third capacitative element unit (a capacitative element unit 105C illustrated in FIG. 17, for example) including a plurality of capacitative elements (sampling capacitors 105C_1, 105C_2 illustrated in FIG. 17, for example) configured to store a third charge depending on a reference voltage corresponding to a third digital code (DC (DCN) illustrated in FIGS. 18A to 18Q, for example), a third switching element unit (a switch unit 103C, 104C illustrated in FIG. 17, for example) including a plurality of switching elements (switches 103C_1, 103C_2, 104C_1, and 104C_2) configured to store the third charge in the plurality of capacitative elements of the third capacitative element unit, respectively, and to transfer the third charge. The third switching element unit may be configured to store the third charge in the plurality of capacitative elements of the third capacitative element unit in accordance with a plurality of clock signals (clock signals ΦS1C, ΦS2C illustrated in FIG. 18B, for example) which are set such that sampling timings are different from each other.

Furthermore, according to one aspect of the present disclosure, in the D/A converter according to the above-mentioned aspects, the first switching element unit may be configured to store the first charge in the plurality of capacitative elements of the first capacitative element unit while the second switching element unit transfers the second charge stored in the plurality of capacitative elements and while the third switching element unit transfers the third charge stored in the plurality of capacitative elements, the second switching element unit may be configured to store the second charge in the plurality of capacitative elements of the second capacitative element unit while the first switching element unit transfers the first charge stored in the plurality of capacitative elements and while the third switching element unit transfers the third charge stored in the plurality of capacitative elements, and the third switching element unit may be configured to store the third charge in the plurality of capacitative elements of the third capacitative element unit while the first switching element unit transfers the first charge stored in the plurality of capacitative elements and while the second switching element unit transfers the second charge stored in the plurality of capacitative elements.

Furthermore, according to one aspect of the present disclosure, in the D/A converter according to the above-mentioned aspects, a period when the first charge stored in the first capacitative element unit is transferred, a period when the second charge stored in the second capacitative element unit is transferred, and a third period when the second charge stored in the third capacitative element unit is transferred may be switched in a given order.

Furthermore, according to one aspect of the present disclosure, in the D/A converter according to the above-mentioned aspects, anyone of the charges stored in the capacitative element units may be always transferred.

Furthermore, according to one aspect of the present disclosure, in the D/A converter according to the above-mentioned aspects, the first switching element unit, the second switching element unit and the third switching element unit may be configured to operate in turn.

Furthermore, according to one aspect of the present disclosure, in the D/A converter according to the above-mentioned aspects, jitters may be added to falling edges of the clock signals.

Furthermore, according to one aspect of the present disclosure, in the D/A converter according to the above-mentioned aspects, jitters may be added to rising edges of the clock signals.

Hereinafter, the first embodiment to the fourth embodiment of the present invention will be described with reference to the drawings.

First Embodiment

FIG. 1 is a circuit diagram illustrating a D/A converter according to the first embodiment of the present invention. The D/A converter 1 according to the first embodiment includes a sampling circuit 2, an integration circuit including an integral capacity element 106 and an operational amplifier 107, a controlling circuit 159 configured to supply a clock for driving the sampling circuit, and a digital circuit to be described later (see FIG. 16). It is to be noted that the digital circuit is provided in the preceding stage of the D/A converter illustrated in FIG. 1.

The D/A converter 1 according to the first embodiment includes the sampling circuit 2 to convert an inputted digital signal to an analog signal. The D/A converter 1 according to the first embodiment includes the digital circuit (a digital circuit 201 illustrated in FIG. 16) generating digital codes as the input signal, a capacitative element unit 105A for storing a charge produced by the digital code input from the digital circuit, and a capacitative element unit 105B for storing a charge produced by the digital code input from the digital circuit. The first capacitative element unit 105A includes capacitative elements 105A_1 and 105A_2. Furthermore, the second capacitative element unit 105B includes capacitative elements 105B_1 and 105B_2.

Furthermore, the D/A converter 1 according to the first embodiment includes a switch unit 104A. The switch unit 104A includes switches 104A_1 and 104A_2. The switches 104A_1 and 104A_2 store the charges in the sampling capacitors 105A_1 and 105A_2 of the first capacitative element unit 105A, respectively, as well as transfer the stored charges. Furthermore, the D/A converter 1 according to the first embodiment includes a switch unit 104B. The switch unit 104B includes switches 104B_1 and 104B_2. The switches 104B_1 and 104B_2 store the charges in the sampling capacitors 105B_1 and 105B_2 of the second capacitative element unit 105B, respectively, as well as transfer the stored charges.

Furthermore, the D/A converter 1 includes the integral capacity element 106 to which the charges stored in the first capacitative element unit 105A and the second capacitative element unit 105B are transferred, and the operational amplifier 107 connected to the switch unit 104A and the switch unit 104B. The switch unit 104A and the switch unit 104B operate alternately.

Furthermore, the sampling circuit 2 includes switches 101A_1, 101A_2, 101B_1, 101B_2, 102A_1, 102A_2, 102B_1, 102B_2, 103A_1, 103A_2, 103B_1, and 103B_2.

The switch 101A_1, the sampling capacitor 105A_1 and the switch 102A_1 are connected to one another in series.

Furthermore, the switch 101A_2, the sampling capacitor 105A_2 and the switch 102A_2 are connected to one another in series.

The switch 103A_1, the sampling capacitor 105A_1 and the switch 104A_1 are connected to one another in series. The switch 103A_2, the sampling capacitor 105A_2 and the switch 104A_2 are connected to one another in series.

The switch 101B_1, the sampling capacitor 105B_1 and the switch 102B_1 are connected to one another in series. Furthermore, the switch 101B_2, the sampling capacitor 105B_2 and the switch 102B_2 are connected to one another in series.

The switch 103B_1, the sampling capacitor 105B_1 and the switch 104B_1 are connected to one another in series. The switch 103B_2, the sampling capacitor 105B_2 and the switch 104B_2 are connected to one another in series.

The switch 103A_1 and the switch 103A_2 constitute the switch unit 103A. The switch 103B_1 and the switch 103B_2 constitute the switch unit 103B. The switch 104A_1 and the switch 104A_2 constitute the switch unit 104A. The switch 104B_1 and the switch 104B_2 constitute the switch unit 104B.

The switch 101A_1 is connected to an input terminal to which an analog input signal VREFA_1 is input. The switch 101A_2 is connected to an input terminal to which an analog input signal VREFA_2 is input. The switch 101B_1 is connected to an input terminal to which an analog input signal VREFB_1 is input. The switch 101B_2 is connected to an input terminal to which an analog input signal VREFB_2 is input. The switches 102A_1, 102A_2, 102B_1, and 102B_2 are connected to a terminal 113 to which an analog reference voltage Vcom is supplied.

The switch 103A_1 is connected between the output terminal of the operational amplifier 107 and a point between the switch 101A_1 and the sampling capacitor 105A_1. The switch 103A_2 is connected between the output terminal of the operational amplifier 107 and a point between the switch 101A_2 and the sampling capacitor 105A_2. The switch 103B_1 is connected between the output terminal of the operational amplifier 107 and a point between the switch 101B_1 and the sampling capacitor 105B_1. The switch 103B_2 is connected between the output terminal of the operational amplifier 107 and a point between the switch 101B_2 and the sampling capacitor 105B_2.

The one end of each of the switches 104A_1, 104A_2, 104B_1, and 104B_2 as an output of the sampling circuit 2 is connected to one end of the integral capacity element 106 and the inverted input terminal of the operational amplifier 107.

The integral capacity element 106 is connected between the inverted input terminal and the output terminal of the operational amplifier 107. The non-inverted input terminal of the operational amplifier 107 is connected to a terminal 114 to which the analog voltage Vcom is supplied.

The respective switches are driven by the clock signals supplied from the controlling circuit 159 and perform on/off operation.

Furthermore, in FIG. 1, the circuit having elements reference numerals of which are given "A" and the circuit having elements reference numerals of which are given "B" have the same configuration.

In FIG. 1, the capacitance of the sampling capacitor 105A_1 may equal to that of the sampling capacitor 105A_2. Similarly, the capacitance of the sampling capacitor 105B_1 may equal to that of the sampling capacitor 105B_2.

The analog input signals VREFA_1, VREFA_2, VREFB_1, and VREFB_2 are input from the input terminal to the sampling circuit 2 having the above-mentioned configuration.

The analog input signal VREFA_1 is sampled by the switch 102A_1. The charge is stored in the sampling capacitor 105A_1 by the sampling. Furthermore, the analog input signal VREFA_2 is sampled by the switch 102A_2. The charge is stored in the sampling capacitor 105A_2 by the sampling.

Similarly, the analog input signal VREFB_1 is sampled by the switch 102B_1. The charge is stored in the sampling capacitor 105B_1 by the sampling. Furthermore, the analog input signal VREFB_2 is sampled by the switch 102B_2. The charge is stored in the sampling capacitor 105B_2 by the sampling.

FIG. 2 is a view illustrating one example of a circuit connected to the input terminals to which the analog input signals VREFA_1, VREFA_2 are input. An analog reference voltage VREFH is connected the input terminals to which the analog input signals VREFA_1, VREFA_2 are input via a switch 1401. An analog reference voltage VREFL is connected the input terminals to which the analog input signals VREFA_1, VREFA_2 are input via a switch 1402. The switches 1401 and 1402 are turned on and off by the digital codes DA, DAN issued from the digital circuit to be described later.

The digital codes DA, DAN are one-bit signals. The digital code DAN is a signal obtained by inverting the digital code DA. When the digital code DA is at an H (High) level, the digital code DAN is at an L (Low) level. Furthermore, when the digital code DA is at the L level, the digital code DAN is at the H level. The switch 1401 is turned on when the digital code DA is at the H level, and is turned off when the digital code DA is at the L level.

The switch 1402 is turned on when the digital code DAN is at the H level, and is turned off when the digital code DAN is at the L level. As a result, when the digital code DA is at the H level, the analog reference voltage VREFH is supplied to the input terminals to which the analog input signals VREFA_1, VREFA_2 are input. When the digital code DA is at the L level, the analog reference voltage VREFL is supplied to the input terminals to which the analog input signals VREFA_1, VREFA_2 are input.

A similar circuit to that illustrated in FIG. 2 is also connected to the input terminals to which the analog input signals VREFB_1, VREFB_2 are supplied. The switches 1401 and 1402 are turned on and off by digital codes DB and DBN issued from the digital circuit (not illustrated).

Next, the operation of the D/A converter 1 illustrated in FIG. 1 will be described. In the first embodiment, it is assumed that the digital codes DA, DB applied to the switch circuit illustrated in FIG. 2 are at the H level. That is, there is described herein a case where the analog reference voltage VREFH is supplied to all the input terminals to which the analog input signals VREFA_1, VREFA_2, VREFB_1, VREFB_2 illustrated in FIG. 1 are input.

However, the first embodiment of the present invention is not limited to the case where the digital codes DA, DB are at the H level and the analog reference voltage VREFH is supplied to all the input terminals to which the analog input signals VREFA_1, VREFA_2, VREFB_1, VREFB_2 are input.

The switches 101A_1, 101A_2, 101B_1, 101B_2, 102A_1, 102A_2, 102B_1, 102B_2, 103A_1, 103A_2, 103B_1, 103B_2, 104A_1, 104A_2, 104B_1, and 104B_2 store the charges in the sampling capacitors 105A_1, 105A_2, 105B_1, and 105B_2 in accordance with the switching.

The charges stored in the sampling capacitors 105A_1, 105A_2, 105B_1, and 105B_2 are transferred to the integral capacity element 106 by the switching of the switches 101A_1, 101A_2, 101B_1, 101B_2, 102A_1, 102A_2, 102B_1, 102B_2, 103A_1, 103A_2, 103B_1, 103B_2, 104A_1, 104A_2, 104B_1, and 104B_2.

The operational amplifier 107 receives the analog reference voltage Vcom at the non-inverted input terminal and outputs the analog output signal Vout from the output terminal.

The sampling circuit 2 illustrated in FIG. 1 includes plural of sampling capacitors (i.e. the four sampling capacitors 105A_1, 105A_2, 105B_1, and 105B_2 in the example illustrated in FIG. 1).

The amount of the charge stored in the sampling capacitor 105A_1 is set by the switching operation of the switches 101A_1 and 102A_1. The amount of the charge stored in the sampling capacitor 105A_2 is set by the switching operation of the switches 101A_2 and 102A_2.

Furthermore, the amount of the charge stored in the sampling capacitor 105B_1 is set by the switching operation of the switches 101B_1 and 102B_1. The amount of the charge stored in the sampling capacitor 105B_2 is set by the switching operation of the switches 101B_2 and 102B_2.

It is to be noted that the number of the sampling capacitors 105A_1, 105A_2, 105B_1, and 105B_2 of the D/A converter 1 according to the first embodiment is not limited to four, obviously, and has only to be M*2, where M is a natural number.

In the sampling circuit 2 illustrated in FIG. 1, the number of the switches increases as the number M*2 of the sampling capacitors increases. Furthermore, the number of the clock signals driving the switches increases as the number M*2 of the sampling capacitors increases. It is to be noted that even if the number of the sampling capacitors increases, the configuration illustrated in FIG. 1 other than the sampling circuit will not change.

Furthermore, when additional sampling capacitors are added to the sampling circuit 2 illustrated in FIG. 1, the sum of the capacitances of the sampling capacitors after the addition may equal to the sum of the capacitances of the sampling capacitors 105A_1, 105A_2, 105B_1, and 105B_2. In this way, by configuring the sampling circuit 2 such that the sum of the capacitances of the sampling capacitors included therein does not change before and after the addition of the sampling capacitors, and by adequately allocating the capacitance of the sampling capacitors included in the sampling circuit 2 including the added sampling capacitors and the operating timing, it is possible to form an analog Finite Impulse Response (FIR) filter capable of reducing a gain at a specific frequency included in the output signal Vout.

In the first embodiment, the switch 101A_1 and the switch 102A_1 are driven by a clock signal ΦS1A, and the switch 101A_2 and the switch 102A_2 are driven by a clock signal ΦS2A, as illustrated in FIG. 1. Furthermore, the switch 101B_1 and the switch 102B_1 are driven by a clock signal ΦS1B, and the switch 101B_2 and the switch 102B_2 are driven by a clock signal ΦS2B.

Furthermore, the switches 103A_1, 103A_2, 104A_1 and 104A_2 are driven by a clock signal ΦIA. The switches 103B_1, 103B_2, 104B_1 and 104B_2 are driven by a clock signal ΦIB.

FIGS. 3A to 3L are timing charts of the clock signals input to and output from the D/A converter 1 illustrated in FIG. 1.

The above-mentioned clock signals ΦS1A, ΦS2A, ΦIA, ΦS1B, ΦS2B, and ΦIB are turned on and off at the timings illustrated in FIGS. 3A to 3F, respectively. It is to be noted that FIG. 3A illustrates the clock signal ΦS1A, FIG. 3B illustrates the clock signal ΦS2A, FIG. 3C illustrates the clock signal ΦIA, FIG. 3D illustrates the clock signal ΦS1B, FIG. 3E illustrates the clock signal ΦS2B, and FIG. 3F illustrates the clock signal ΦIB.

Furthermore, FIG. 3G illustrates a digital signal Din, FIG. 3H illustrates the digital code DA (DAN), FIG. 3I illustrates the digital code DB (DBN), FIG. 3J illustrates an analog data VA, FIG. 3K illustrates an analog data VB, and FIG. 3L illustrates the output signal Vout.

As illustrated in FIGS. 3A to 3F, the clock signal ΦS1A, the clock signal ΦS2A, the clock signal ΦS1B, and the clock signal ΦS2B are at the H level at time intervals of the same length, and become the H level in turn one by one. Specifically, as illustrated in FIGS. 3A to 3F, the clock signals become the H level in the order of ΦS1A, ΦS2A, ΦS1B, ΦS2B, ΦS1A, ΦS2A, . . . , repeatedly, and any one of the clock signals becomes the H level at even intervals. That is, the clock signals ΦS1A, ΦS2A, ΦS1B, and ΦS2B are set such that the sampling timings of the respective sampling capacitors 105A_1, 105A_2, 105B_1, and 105B_2 which are set by the respective rising edges of the clock signals, come at even intervals, repeatedly.

Furthermore, the clock signal ΦIA is at the H level within a period (the first switching element non-storing period) from the falling edge of the clock signal ΦS2A to the next rising edge of the clock signal ΦS1A. The clock signal Φ1A is set such that an integrate timing which is a timing when the charges stored in the sampling capacitors 105A_1 and 105A_2 are transferred to the integral capacity element 106 comes within the period from the falling edge of the clock signal ΦS2A to the next rising edge of the clock signal ΦS1A.

Similarly, the clock signal ΦIB is at the H level within a period (the second switching element non-storing period) from the falling edge of the clock signal ΦS2B to the next rising edge of the clock signal ΦS1B. The clock signal ΦIB is set such that an integrate timing which is a timing when the charges stored in the sampling capacitors 105B_1 and 105B_2 are transferred to the integral capacity element 106 comes within the period from the falling edge of the clock signal ΦS2B to the next rising edge of the clock signal ΦS1B.

That is, the switch unit 104A stores the charges in the sampling capacitors 105A_1 and 105A_2 of the first capacitative element unit 105A within the non-storing period of the switch unit 104B other than a period when the switch unit 104B stores the charges in the sampling capacitors 105B_1 and 105B_2. The sampling timings of storing the charges in the sampling capacitors 105A_1 and 105A_2 are set to be different from each other by the clock signals.

Furthermore, the switch unit 104B stores the charges in the sampling capacitors 105B_1 and 105B_2 of the second capacitative element unit 105B within the non-storing period of the switch unit 104A other than a period when the switch unit 104A stores the charges in the sampling capacitors 105A_1 and 105A_2. The sampling timings of storing the charges in the sampling capacitors 105B_1 and 105B_2 are set to be different from each other by the clock signals.

Furthermore, the digital signal Din includes the digital codes. The digital circuit to be described later outputs the digital codes DA (DAN) which are even-numbered codes in the digital signal Din and the digital codes DB (DBN) which are odd-numbered codes in the digital signal Din. Hereinafter, D[i] denotes the digital code DA (DAN), and D[j] denotes the digital code DB (DBN), where i is an even number and j is an odd number.

Next, the operation of the D/A converter 1 of the first embodiment will be described.

When the clock signal ΦS1A becomes the H level, the digital code D[0] is sampled by the switches 101A_1 and 102A_1. The charge is stored in the sampling capacitor 105A_1 by the sampling. When the clock signal ΦS2A becomes the H level, the digital code D[0] is sampled by the switches 101A_2 and 102A_2. The charge is stored in the sampling capacitor 105A_2 by the sampling.

When the clock signal ΦIA becomes the H level, the charges stored in the sampling capacitors 105A_1 and 105A_2 are transferred to the integral capacity element 106 by the switches 103A_1, 103A_2, 104A_1, and 104A_2. When the transferred charge is considered as the analog data VA for the sake of convenience, the analog data VA is represented as A[0].

Similarly, when the clock signal ΦS1B becomes the H level, the digital code D[1] is sampled by the switches 101B_1 and 102B_1. The charge is stored in the sampling capacitor 105B_1 by the sampling. when the clock signal ΦS2B becomes the H level, the digital code D[1] is sampled by the switches 101B_2 and 102B_2. The charge is stored in the sampling capacitor 105B_2 by the sampling.

When the clock signal ΦIB becomes the H level, the charges stored in the sampling capacitors 105B_1 and 105B_2 are transferred to the integral capacity element 106 by the switches 103B_1, 103B_2, 104B_1, and 104B_2. The transferred charge is considered as the analog data VB, for the sake of convenience. The analog data VB is represented as A[1].

In the first embodiment, the switch unit 104A and the switch unit 104B are configured to operate alternately. Therefore, the charge of the analog data VA and the charge of the analog data VB are transferred to the integral capacity element 106 alternately, and are output from the output terminal of the operational amplifier 107 as the output signal Vout.

In the above-mentioned configuration, the switch unit 104A and the switch unit 104B are configured to operate alternately. However, the first embodiment is not limited to such a configuration. That is, in the first embodiment, a group of switches includes the switch unit 104A and the switch unit 104B may operate in an order with a specific regularity, periodically. In other words, the group of switches may operate sequentially in turn.

Next, there is described that it is possible in the first embodiment to reduce the noise produced in the D/A converter 1, even when the high-frequency component and a periodic noise (i.e. the noise due to the inrush current to the analog signal processing circuit, hereinafter may be simply referred to as noise) is superimposed on the analog reference voltages VREFH, VREFL.

Figure 26:
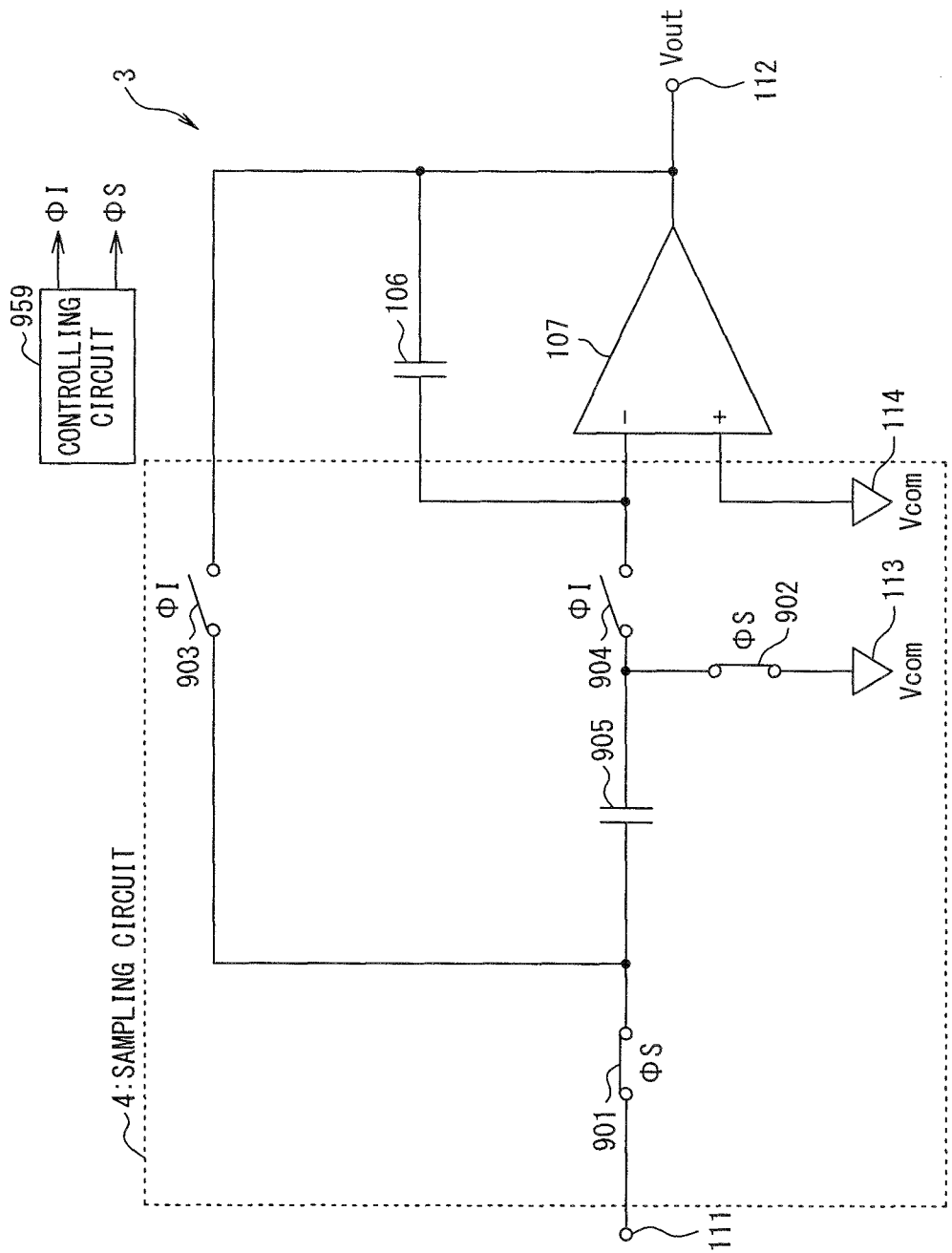
FIG. 26 is a circuit diagram illustrating an example of a conventional D/A converter.

In order to facilitate the understanding of the operation and effect of the first embodiment, the operation of the conventional sampling circuit 4 illustrated in FIG. 26 can be used as references. That is, the configuration of the D/A converter 3 other than the sampling circuit 04 is the same to the integration circuit part of the D/A converter 1 illustrated in FIG. 1. Therefore, the description for the configuration in the first embodiment corresponding to the configuration illustrated in FIG. 27 and FIG. 28 is omitted.

The operation of the sampling circuit 2 according to the first embodiment illustrated in FIG. 1 will be described below. The sampling circuit 2 according to the first embodiment has a configuration in which the sampling capacitor 905 in the conventional sampling circuit 4 illustrated in FIG. 26 is divided into plural capacitors. As an example, when the sampling capacitor 905 is divided into M capacitors, where M is a natural number, it is possible to obtain the analog FIR filter characteristic.

The analog FIR filter forms zero points. The frequencies at which the zero points are formed are represented by the following expression (1)

$$F0 = FS*(k/M) \quad (1)$$

K=1, 2, . . . , M−1, M+1, . . . , 2*M×1, 2*M+1, . . . .

In the expression (1), FS denotes a sampling frequency, and k denotes an integer other than the integral multiple of M.

Figure 4:
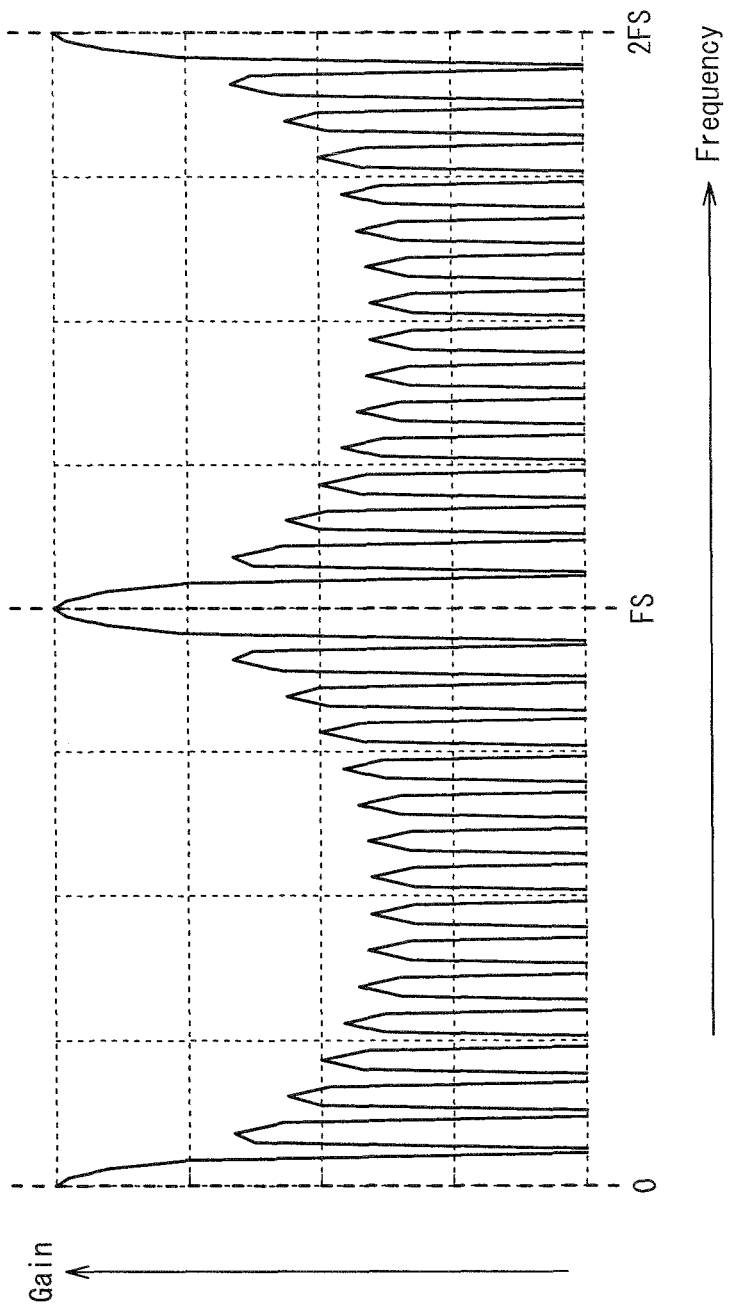
FIG. 4 is a view illustrating a frequency characteristic obtained in a sampling circuit 2 illustrated in FIG. 1 by dividing a sampling capacitor.

FIG. 4 is a view illustrating a frequency characteristic obtained in the sampling circuit 2 illustrated in FIG. 1 by dividing a sampling capacitor. FIG. 4 illustrates, for example, the analog FIR filter characteristic in a case the number M of the sampling capacitors is 16. It is to be noted that FIG. 4 represents the frequency in abscissa and the gain in ordinate. Furthermore, the frequency FS represented on the abscissa axis is the sampling frequency.

It is to be noted that when ΦS1A to ΦS16A are the clock signals to the switches corresponding to M (=16) respective sampling capacitors, the clock signals ΦS1A to ΦS16A are at the H level at time intervals of the same length, and any one of the clock signals becomes the H level at even time intervals. Therefore, by using the clock signals ΦS1A to ΦS16A, the sampling timing which is set by the falling edges of the respective clock signals comes at even time intervals. Furthermore, the capacitance ratio among sixteen sampling capacitors is set as the sampling capacitor 105A_1:the sampling capacitor 105A_2: . . . :the sampling capacitor 105A_16=1:1: . . . :1.

The D/A converter 1 illustrated in FIG. 1 includes plural sampling capacitors into which the sampling capacitor 905 of the sampling circuit 4 illustrated in FIG. 26 is divided, and includes two sets (i.e. twice of conventional ones) of circuits using plural sampling timings. The D/A converter 1 can obtain the analog FIR filter characteristic by causing the two sets of circuits to perform time-interleave operation. That is, in FIG. 1, the circuit having elements reference numerals of which are given "A" and the circuit having elements reference numerals of which are given "B" have the same configuration. The circuit having elements reference numerals of which are given "A" and the circuit having elements reference numerals of which are given "B" perform the sampling operations alternately, thereby the first embodiment can obtain the analog FIR characteristic. It is to be noted that FIG. 1 illustrates the case where M=2.

It is to be noted that the first embodiment is not limited to the configuration in which the capacitance of the sampling capacitor 905 illustrated in FIG. 26 are divide to M even capacitances. By arbitrarily adjusting the respective capacitances of M sampling capacitors, it is possible to arbitrarily adjust the obtained analog FIR characteristic (frequency characteristic).

(First Specific Example of Analog FIR Characteristic)

FIGS. 3A to 3F are timing charts of clock signals supplied to the respective switches illustrated in FIG. 1. The reference symbol T in FIGS. 3A to 3L represents the cycle (T=1/FS) of the clock signal. The clock signals illustrated in FIGS. 3A to 3F do not contain jitters.

In the example represented in FIGS. 3A to 3F, the clock signal ΦS1A, the clock signal ΦS2A, the clock signal ΦS1B, and the clock signal ΦS2B are at the H level at time intervals of the same length, and any one of the clock signals becomes the H level at even time intervals. That is, the sampling timings of the sampling capacitors 105A_1, 105A_2, 105B_1, and 105B_2 are set to come at even intervals. It is to be noted that the sampling timings of the sampling capacitors 105A_1, 105A_2, 105B_1, and 105B_2 are set by the falling edges of the respective clock signals ΦS1A, ΦS2A, ΦS1B, and ΦS2B.

Figure 5:
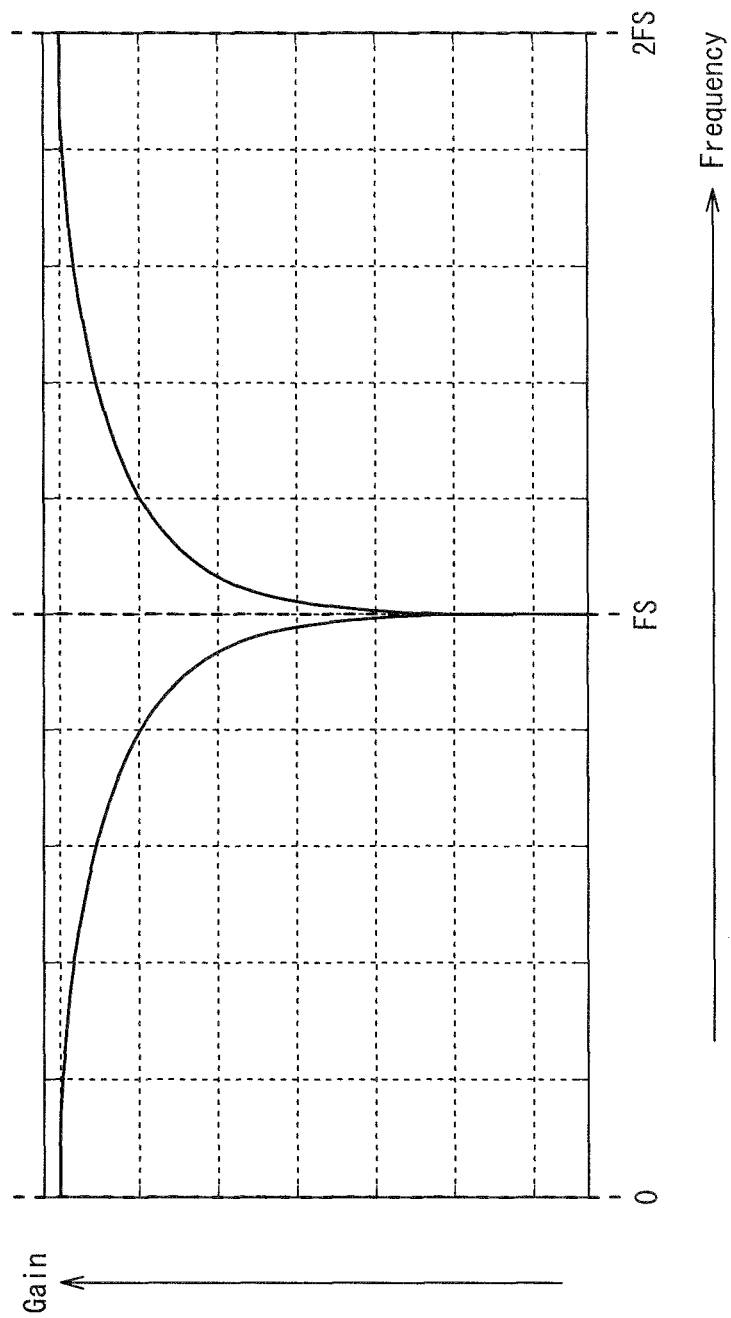
FIG. 5 is a view illustrating an analog FIR characteristic obtained when clock signals illustrated in timing charts of FIGS. 3A to 3F are supplied to sampling capacitors in a D/A converter illustrated in FIG. 1.

FIG. 5 is a view illustrating the analog FIR characteristic obtained when the clock signals illustrated in timing charts of FIGS. 3A to 3F are supplied to the sampling capacitors 105A_1, 105A_2, 105B_1, and 105B_2 in the D/A converter 1 illustrated in FIG. 1. It is to be noted that the capacitance ratios between the sampling capacitors are set as the sampling capacitor 105A_1:the sampling capacitor 105A_2=1:1, and the sampling capacitor 105B_1:the sampling capacitor 105B_2=1:1.

FIG. 5 represents the frequency in abscissa and the gain in ordinate. As illustrated in FIG. 5, the gain becomes substantially zero rapidly at the sampling frequency FS. Therefore, it turns out that the D/A converter 1 according to the first embodiment has the analog FIR characteristic with a great attenuation effect at the sampling frequency FS.

(Second Specific Example of Analog FIR Characteristic)

The respective clock signals according to the first embodiment is not limited to the signals illustrated in the timing charts of FIGS. 3A to 3F. That is, in the first embodiment, the analog FIR characteristic may be arbitrarily adjusted by arbitrarily setting the time intervals of the sampling timings within ranges satisfy the following conditions: the clock signal ΦS1A and the clock signal ΦIA or the clock signal ΦS2A and the clock signal ΦIA are non-overlap clock signals, which are not at the H level at the same time; the clock signal ΦS1B and the clock signal ΦIB or the clock signal ΦS2B and the clock signal ΦIB are the non-overlap clock signals, which are not at the H level at the same time; and the relationship among the clock signal ΦS1A, the clock signal ΦS2A and the clock signal ΦIA is the same to the relationship among the clock signal ΦS1B, the clock signal ΦS2B and the clock signal ΦIB.

Figure 6:
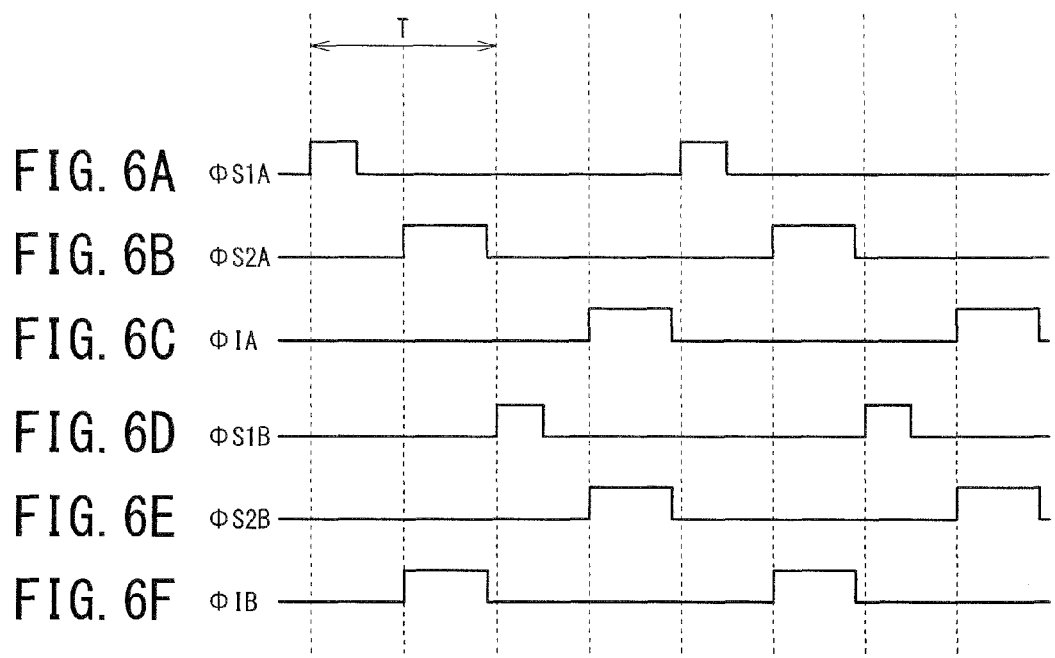
FIGS. 6A to 6F are timing charts of other clock signals supplied to a D/A converter illustrated in FIG. 1.

FIGS. 6A to 6F are timing charts of other clock signals supplied to the D/A converter 1 illustrated in FIG. 1. The respective timing charts illustrated in FIGS. 6A to 6F are obtained by reducing the sampling periods of the clock signal ΦS1A and the clock signal ΦS1B illustrated in FIGS. 3A and 3D to half, and by advancing the sampling timings of the clock signal ΦS1A and the clock signal ΦS1B by a quarter of the cycle. It is to be noted that FIG. 6A illustrates the clock signal ΦS1A, FIG. 6B illustrates the clock signal ΦS2A, FIG. 6C illustrates the clock signal ΦIA, FIG. 6D illustrates the clock signal ΦS1B, FIG. 6E illustrates the clock signal ΦS2B, and FIG. 6F illustrates the clock signal ΦIB, similarly to the FIGS. 3A to 3F.

Figure 7:
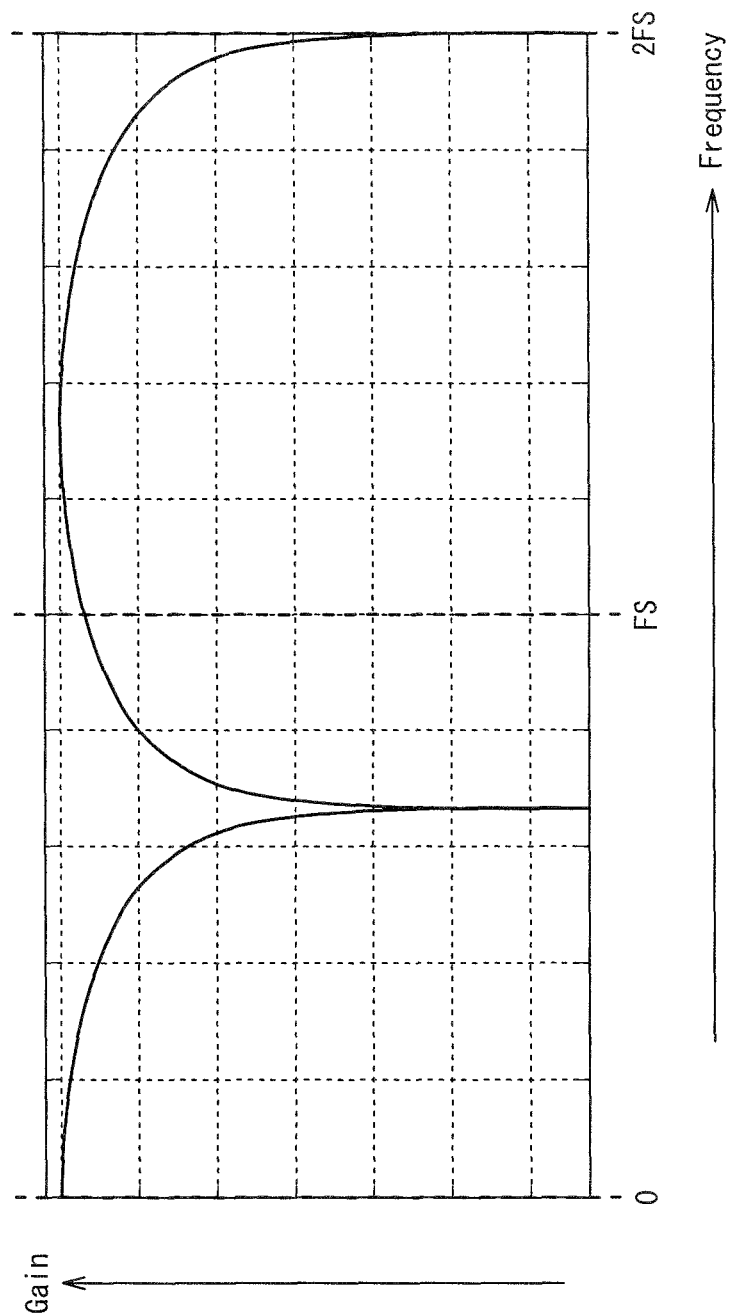
FIG. 7 is a view illustrating an analog FIR characteristic obtained when clock signals illustrated in timing charts of FIGS. 6A to 6F are supplied to sampling capacitors in a D/A converter illustrated in FIG. 1.

FIG. 7 is a view illustrating the analog FIR characteristic obtained when the respective clock signals illustrated in the timing charts of FIGS. 6A to 6F are supplied to the sampling capacitors 105A_1, 105A_2, 105B_1, and 105B_2 in the D/A converter 1 illustrated in FIG. 1. It is to be noted that the capacitance ratios between the sampling capacitors are set as the sampling capacitor 105A_1:the sampling capacitor 105A_2=1:1, and the sampling capacitor 105B_1:the sampling capacitor 105B_2=1:1.

FIG. 7 represents the frequency in abscissa and the gain in ordinate. As illustrated in FIG. 7, the gain becomes substantially zero rapidly at a frequency lower than the sampling frequency FS and the frequency 2FS being double of the sampling frequency FS. Therefore, it turns out that the analog FIR characteristic with a great attenuation effect is obtained in the first embodiment.

(Third Specific Example of Analog FIR Characteristic)

FIGS. 8A to 8F are timing charts of other clock signals supplied to the D/A converter 1 illustrated in FIG. 1. The respective timing charts illustrated in FIGS. 8A to 8F are obtained by extending the sampling periods of the clock signal ΦS1A, the clock signal ΦS2A, the clock signal ΦS1B and the clock signal ΦS2B illustrated in FIGS. 3A to 3F to 1.5 times, by delaying the sampling timings of the clock signal ΦS1A and the clock signal ΦS1B by the quarter of the cycle, and by delaying the integrate timings of the clock signals ΦIA and ΦIB by half cycle.

Figure 8:
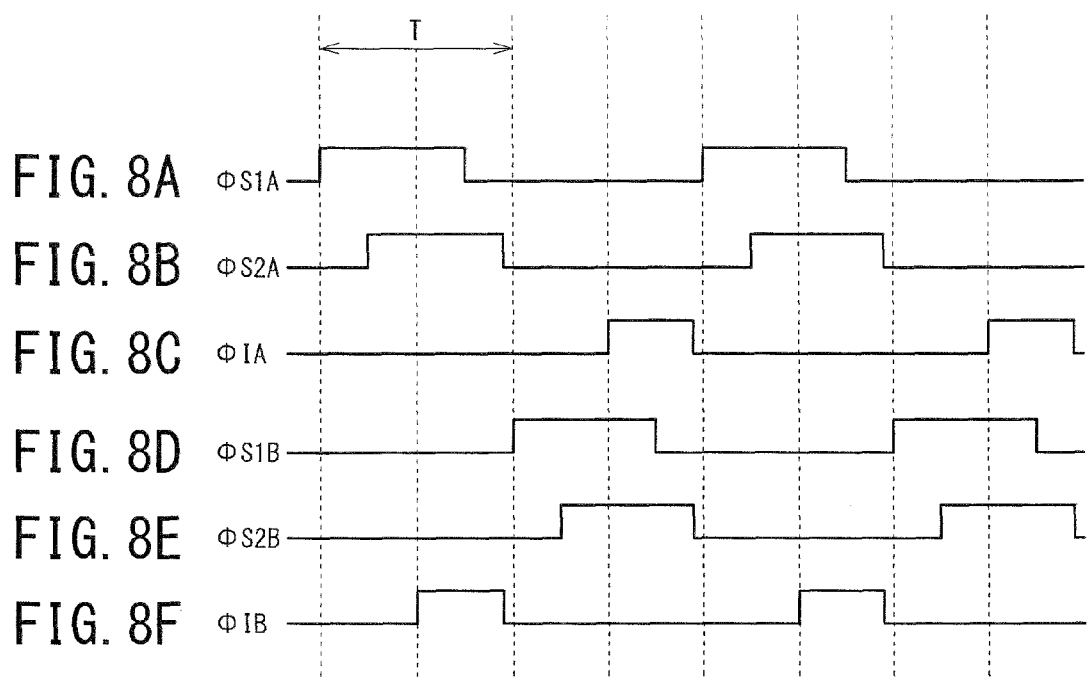
FIGS. 8A to 8F are timing charts of other clock signals supplied to a D/A converter illustrated in FIG. 1.

It is to be noted that FIG. 8A illustrates the clock signal ΦS1A, FIG. 8B illustrates the clock signal ΦS2A, FIG. 8C illustrates the clock signal ΦIA, FIG. 8D illustrates the clock signal ΦS1B, FIG. 8E illustrates the clock signal ΦS2B, and FIG. 8F illustrates the clock signal ΦIB, similarly to the FIGS. 3A to 3F.

Figure 9:
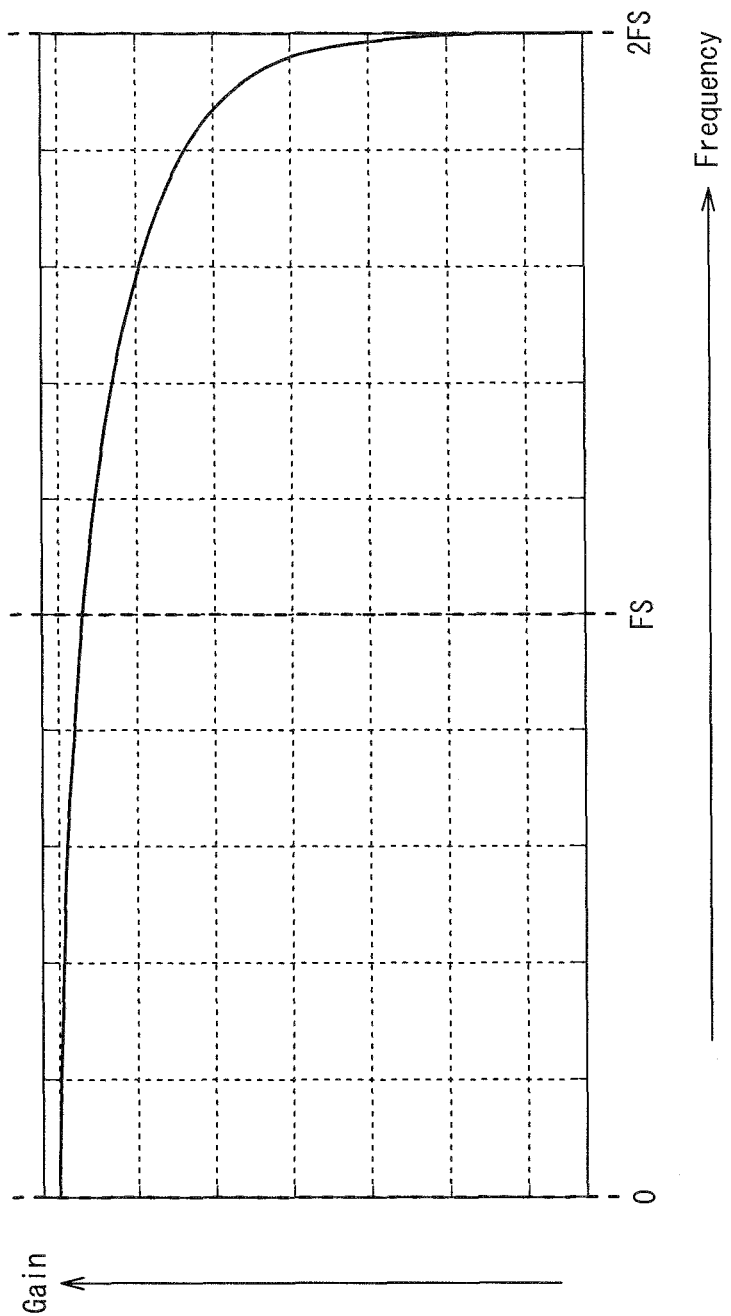
FIG. 9 is view illustrating an analog FIR characteristic obtained when clock signals illustrated in timing charts of FIG. 9 are supplied to sampling capacitors in a D/A converter illustrated in FIG. 1.

FIG. 9 is a view illustrating the analog FIR characteristic obtained when the respective clock signals illustrated in the timing charts of FIGS. 8A to 8F are supplied to the sampling capacitors 105A_1, 105A_2, 105B_1, and 105B_2 in the D/A converter 1 illustrated in FIG. 1. It is to be noted that the capacitance ratios between the sampling capacitors are set as the sampling capacitor 105A_1:the sampling capacitor 105A_2=1:1, and the sampling capacitor 105B_1:the sampling capacitor 105B_2=1:1.

FIG. 9 represents the frequency in abscissa and the gain in ordinate. As illustrated in FIG. 9, the gain is relatively large at the sampling frequency FS and becomes substantially zero at the frequency 2FS being double of the sampling frequency FS. Therefore, it turns out that the analog FIR characteristic with a great attenuation effect is obtained in the first embodiment.

(Fourth Specific Example of Analog FIR Characteristic)

FIGS. 10A to 10F are timing charts of other clock signals supplied to the D/A converter 1 illustrated in FIG. 1. The respective timing charts illustrated in FIGS. 10A to 10F are obtained by extending the sampling periods of the clock signal ΦS1A, the clock signal ΦS2A, the clock signal ΦS1B and the clock signal ΦS2B illustrated in FIGS. 3A to 3F to 1.5 times, by delaying the sampling timings of the clock signal ΦS1A and the clock signal ΦS1B by the quarter of the cycle, and by advancing the integrate timings of the clock signals ΦIA and ΦIB by half cycle.

Figure 10:
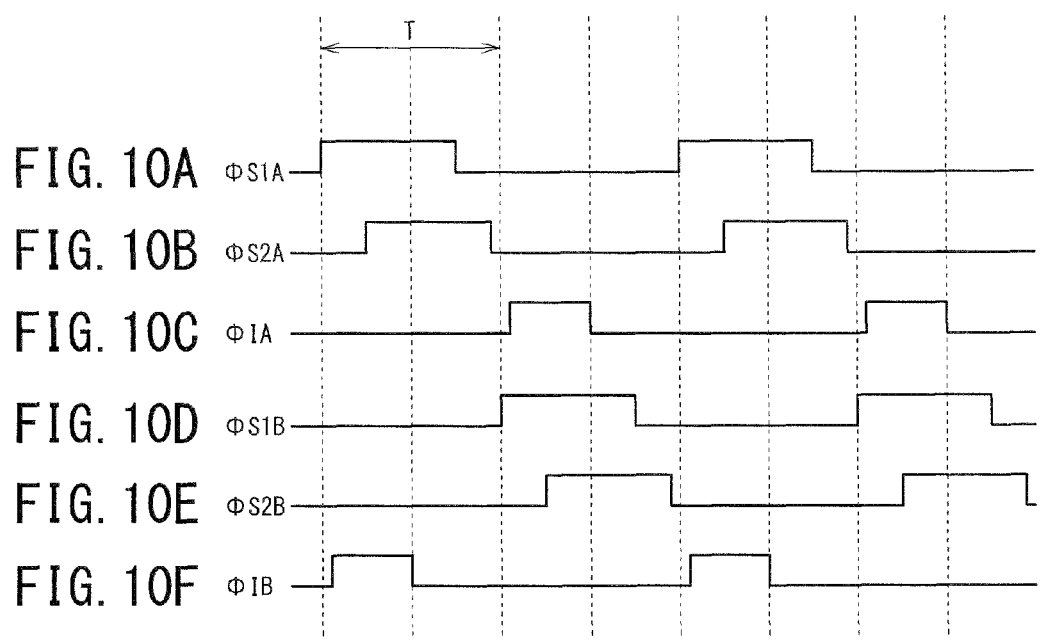
FIGS. 10A to 10F are timing charts of other clock signals supplied to a D/A converter illustrated in FIG. 1.

It is to be noted that FIG. 10A illustrates the clock signal ΦS1A, FIG. 10B illustrates the clock signal ΦS2A, FIG. 10C illustrates the clock signal ΦIA, FIG. 10D illustrates the clock signal ΦS1B, FIG. 10E illustrates the clock signal ΦS2B, and FIG. 10F illustrates the clock signal ΦIB, similarly to the FIGS. 3A to 3F.

The sampling timings of the respective sampling capacitors (that is, the timings when the falling edges of the clock signals ΦS1A, ΦS2A, ΦS1B, and ΦS2B appear) in the timing charts illustrated in FIGS. 10A to 10F are the same to the sampling timings of the respective sampling capacitors (that is, the falling edges of the clock signals ΦS1A, ΦS2A, ΦS1B, and ΦS2B) in the timing charts illustrated in FIGS. 8A to 8F. It is to be noted that the capacitance ratios between the sampling capacitors are set as the sampling capacitor 105A_1:the sampling capacitor 105A_2=1:1, and the sampling capacitor 105B_1:the sampling capacitor 105B_2=1:1.

Therefore, the analog FIR characteristic obtained when the respective clock signals illustrated in the timing charts of FIGS. 10A to 10F are supplied to the sampling capacitors 105A_1, 105A_2, 105B_1, and 105B_2 in the D/A converter 1 illustrated in FIG. 1 is the same to the analog FIR characteristic illustrated in FIG. 9.

(Fifth Specific Example of Analog FIR Characteristic)

Furthermore, as mentioned above, when the sampling capacitor is divided into M capacitors, the first embodiment is not limited to the configuration in which the capacitance of the sampling capacitor is divided to M even capacitances. That is, in the first embodiment, the frequency characteristic of the obtained analog FIR characteristic may be arbitrarily adjusted by arbitrarily adjusting the respective capacitances of M sampling capacitors.

Figure 11:
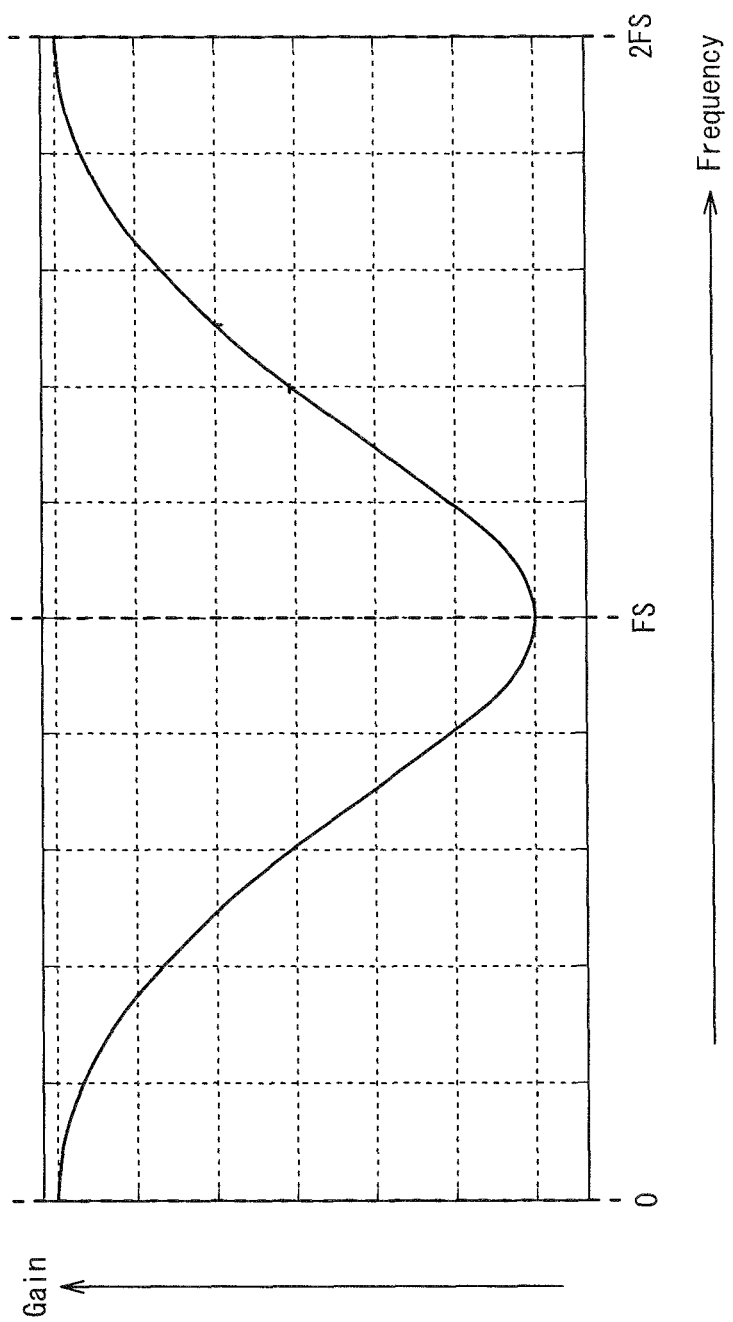
FIG. 11 is a view illustrating a frequency characteristic in a case where capacitance ratios between sampling capacitors are changed in a sampling circuit having an analog FIR characteristic illustrated in FIG. 5.

FIG. 11 is a view illustrating the frequency characteristic in a case where the capacitance ratios between sampling capacitors are changed in the sampling circuit having the analog FIR characteristic illustrated in FIG. 5. The frequency characteristic illustrated in FIG. 11 is an analog FIR characteristic obtained in a case where the capacitance ratios between the sampling capacitors of the D/A converter 1 illustrated in FIG. 1 is set as the sampling capacitor 105A_1:the sampling capacitor 105A_2=3:1, and the sampling capacitor 105B_1: the sampling capacitor 105B_2=3:1, and the respective clock signals illustrated in the timing charts of FIGS. 3A to 3F are supplied to the sampling capacitors 105A_1, 105A_2, 105B_1, and 105B_2.

FIG. 11 represents the frequency in abscissa and the gain in ordinate. As illustrated in FIG. 11, the gain changes sinusoidally as the frequency increases, reaches a minimum near the sampling frequency FS, and reaches a maximum near the frequency 2FS being double of the sampling frequency FS.

(Sixth Specific Example of Analog FIR Characteristic)

Figure 12:
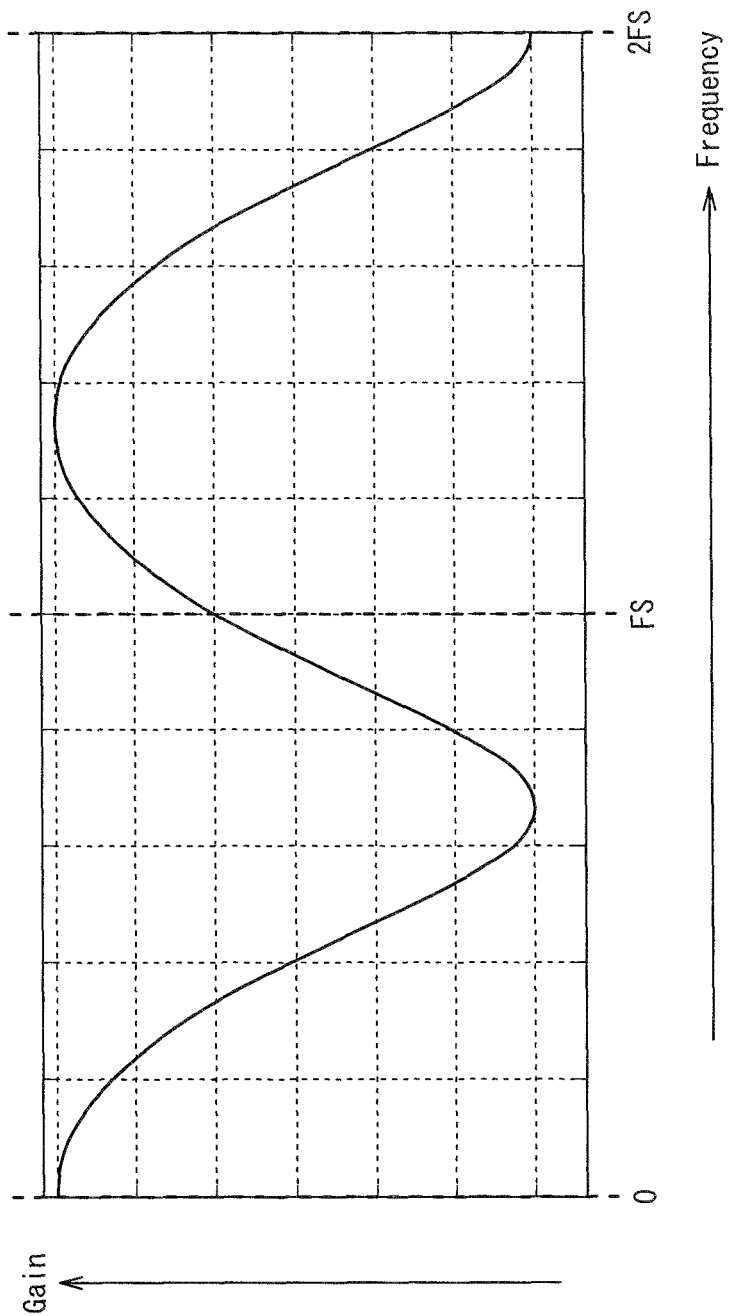
FIG. 12 is a view illustrating a frequency characteristic in a case where capacitance ratios between sampling capacitors are changed in a sampling circuit having an analog FIR characteristic illustrated in FIG. 7.

FIG. 12 is a view illustrating the frequency characteristic in a case where the capacitance ratios between sampling capacitors are changed in a sampling circuit having the analog FIR characteristic illustrated in FIG. 7. The frequency characteristic illustrated in FIG. 12 is an analog FIR characteristic obtained in a case where the capacitance ratios between the sampling capacitors of the D/A converter 1 illustrated in FIG. 1 are set as the sampling capacitor 105A_1:the sampling capacitor 105A_2=3:1, and the sampling capacitor 105B_1: the sampling capacitor 105B_2=3:1, and the respective clock signals illustrated in timing charts of FIGS. 6A to 6F are supplied to the sampling capacitors 105A_1, 105A_2, 105B_1, and 105B_2.

FIG. 12 represents the frequency in abscissa and the gain in ordinate. As illustrated in FIG. 12, the gain changes sinusoidally as the frequency increases, reaches a minimum near a frequency relatively lower than the sampling frequency FS and near the frequency 2FS being double of the sampling frequency FS, and reaches a maximum at frequency zero and near a frequency relatively higher than the sampling frequency FS.

In this way, in the analog FIR filer obtained by the above-mentioned D/A converter 1 according to the first embodiment, the frequencies in which the zero points are formed depend on the capacitance ratios between the sampling capacitors and intervals of the sampling timings of sampling the analog reference voltages VREFH, VREFL.

That is, in the first embodiment, when the intervals of the sampling timings of sampling the analog reference voltages VREFH, VREFL are narrow (i.e. short in the time axis), the zero point is formed in the high frequency side, as illustrated in FIG. 9. Herein, "the intervals of the sampling timings is narrow" means that the interval between the falling edges of the clock signal ΦS1A and the clock signal ΦS2A or the interval between the falling edges of the clock signal ΦS1B and the clock signal ΦS2B is shorter than the interval between the falling edges of the clock signal ΦS1A and the clock signal ΦS2A or the interval between the falling edges of the clock signal ΦS1B and the clock signal ΦS2B illustrated in the timing charts of FIGS. 3A, 3B, 3D, and 3E, as illustrated in the timing charts of FIGS. 8A to 8F.

Conversely, when the intervals of the sampling timings of sampling the analog reference voltages VREFH and VREFL by the sampling capacitors are wide (i.e. long in the time axis), the zero point is formed in the low frequency side, as illustrated in FIG. 7. Herein, "the intervals of the sampling timings is wide" means that the interval between the falling edges of the clock signal ΦS1A and the clock signal ΦS2A or the interval between the falling edges of the clock signal ΦS1B and the clock signal ΦS2B is longer than the interval between the falling edges of the clock signal ΦS1A and the clock signal ΦS2A or the interval between the falling edges of the clock signal ΦS1B and the clock signal ΦS2B illustrated in the timing charts of FIGS. 3A, 3B, 3D, and 3E, as illustrated in the timing charts of FIGS. 6A to 6F.

Furthermore, in the first embodiment, the sampling capacitor is divided into the plural capacitors as illustrated in FIG. 1, and the two sets (i.e. twice of conventional ones) of circuits using plural sampling timings are provided to perform the time-interleave operation. Such a configuration enables the D/A converter 1 according to the first embodiment to perform sampling in all of phases, instead of dividing the sampling capacitor in only a sampling phase to perform sampling in half of the phases. Therefore, in the first embodiment, it is possible to set the intervals of sampling timings of sampling the analog reference voltages VREFH, VREFL in the sampling capacitors to be wide (long in the time axis) to form the zero point in a low frequency range and to form the cut off point in the low frequency range.

It is to be noted that the sampling periods, the integrate timings and the periods thereof do not affect on the analog FIR characteristic of the sampling circuit 2. The analog FIR characteristic is affected by the sampling intervals.

The first embodiment uses the sampling circuit 2 including the plural sampling capacitors into which the sampling capacitor 905 illustrated in FIG. 26 is divided. In the case where sixteen sampling capacitors is provided in the first embodiment, for example, it is possible to obtain the analog FIR characteristic illustrated in FIG. 4. Furthermore, in the first embodiment, it is possible to arbitrarily adjust the analog FIR characteristic as illustrated in FIG. 5, FIG. 7, FIG. 9, FIG. 11, and FIG. 12, by adjusting the sampling timings of the sampling capacitors and the capacitance ratios between the sampling capacitors.

Therefore, in the first embodiment, it is possible to suppress the high-frequency component, such as a frequency component higher than the half of the sampling frequency of the sampling circuit 2. That is, in the first embodiment, it is possible to provide the sampling circuit 2 having a frequency characteristic resulting in the effect of suppressing the high-frequency component.

Furthermore, the D/A converter 1 illustrated in FIG. 1 includes the circuit having elements reference numerals of which are given "A" and the circuit having elements reference numerals of which are given "B" and causes the sampling capacitors included in the two sets of circuits to perform the sampling operations alternately. As a result, in the D/A converter 1, while the sampling capacitors of one circuit (e.g. the circuit having elements reference numerals of which are given "A") perform the sampling operations, the other circuit (e.g. the circuit having elements reference numerals of which are given "B") transfers the charge to the integral capacity element 106 in parallel with the sampling operations, as illustrated in FIGS. 3A to 3F.

Therefore, the circuit having elements reference numerals of which are given "A", for example, only has to transfer the charge to the integral capacity element 106 by the clock signal ΦIA within a period from the timing of the falling edge of the clock signal ΦS2A to the timing of the rising edge of the clock signal ΦS1A, as illustrated in FIGS. 3A to 3F. For this reason, in the first example, it is possible to increase the degrees of freedom in setting of the timing when the sampling capacitor in the D/A converter 1 transfer the charge to the integral capacity element 106.

Furthermore, the D/A converter 1 of the first embodiment can diffuse the radiation noise due to the inrush current in the analog part to suppress the radiation noise effectively. This is because double number of sampling capacitors is provided to operate in a time division manner whereby the frequency characteristic of the analog FIR filter is given to the sampling circuit itself. That is, the effect of effectively suppressing the radiation noise is obtained since it is unnecessary to provide an additional analog part such as an analog circuit to obtain a frequency characteristic of an analog FIR filter.

Furthermore, in the first embodiment, it is possible to obtain the above-mentioned effect with only the increase in the sampling circuit without the increase in the noise or the like, and to reduce the cost.

Furthermore, as mentioned above, it is possible to suppress the noise produced in the analog part, in the first embodiment, by simply adjusting the operating timings or the capacitances of the respective sampling capacitors in the sampling circuit 2. Thus, an advanced process technology or the like is not needed.

Furthermore, in the first embodiment, it is possible to provide the D/A converter 1 without the increase in the noise or the like by adjusting the specification of the sampling circuit. Thus, the downsizing of the electronic equipment is not obstructed.

Second Embodiment

The D/A converter according to the second embodiment has the same circuit configuration to that of the D/A converter 1 according to the first embodiment illustrated in FIG. 1.

In the second embodiment, the switches 101A_1 and 102A_1 illustrated in FIG. 1 are driven by the clock signal ΦS1A, the switches 101A_2 and 102A_2 are driven by the clock signal ΦS2A, the switches 101B_1 and 102B_1 are driven by the clock signal ΦS1B, the switches 101B_2 and 102B_2 are driven by the clock signal ΦS2B, the switches 103A_1, 103A_2, 104A_1 and 104A_2 are driven by the clock signal ΦIA, and the switches 103B_1, 103B_2, 104B_1 and 104B_2 are driven by the clock signal ΦIB. However, it is to be noted that these clock signals perform on/off operation in accordance with the timing charts illustrated in FIGS. 13A to 13F, in the second embodiment.

Hereinafter, the operation of the D/A converter according to the second embodiment will be described bellow. Herein, there is describe that it is possible in the sampling circuit 2 according to the second embodiment to reduce the noise produced in the D/A converter using the sampling circuit 2 and to obtain an effect of attenuating a high frequency component in a wider band, even if the high frequency component and the periodic noise (i.e. the noise due to due to the inrush current to the analog signal processing circuit, hereinafter, may be simply referred to as noise) are superimposed on the analog reference voltages VREFH, VREFL.

Figure 13:
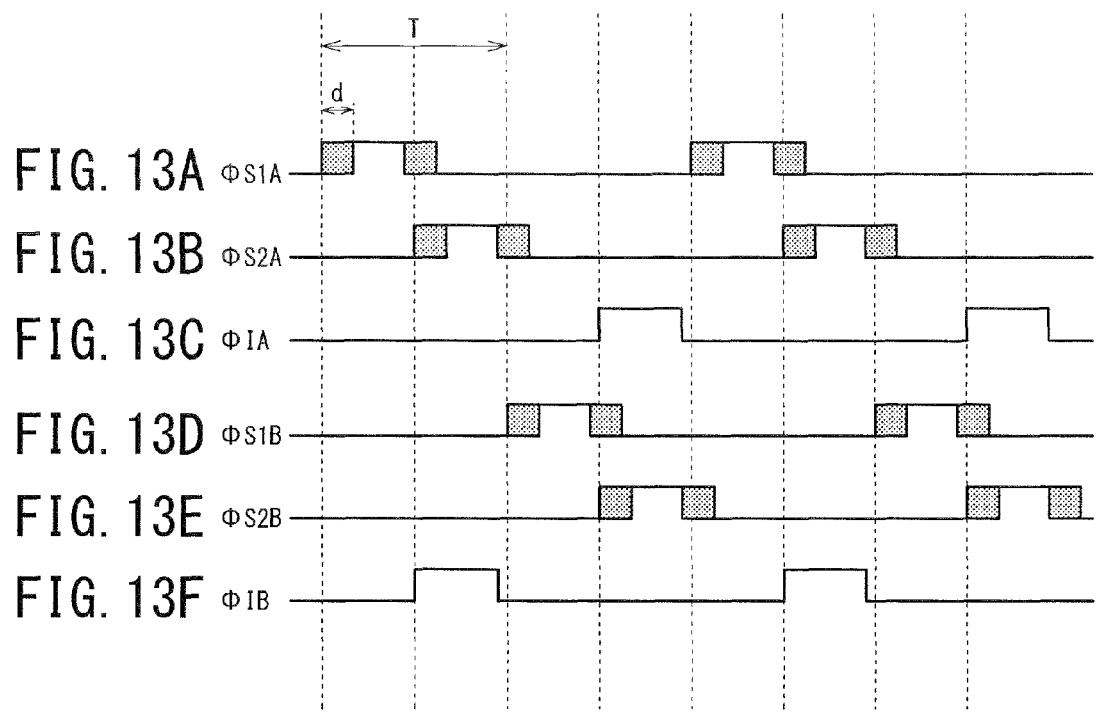
FIGS. 13A to 13F are examples of timing charts of clock signals supplied to respective switches in a D/A converter according to the second embodiment of the present invention.

FIGS. 13A to 13F are views illustrating examples of timing charts of clock signals supplied to the respective switches in the D/A converter according to the second embodiment of the present invention. Jitters are added to the clock signals illustrated in the FIGS. 13A, 13B, 13D and 13E. FIG. 13A illustrates the clock signal ΦS1A, FIG. 13B illustrates the clock signal ΦS2A, FIG. 13C illustrates the clock signal ΦIA, FIG. 13D illustrates the clock signal ΦS1B, FIG. 13E illustrates the clock signal ΦS2B, and FIG. 13F illustrates the clock signal ΦIB. The jitters are applied to the rising edges and the falling edges of the clock signals of FIGS. 13A, 13B, 13D and 13E.

In the examples illustrated in FIGS. 13A to 13F, the clock signals ΦS1A, ΦS2A, ΦS1B and ΦS2B are set such that any one of these signals is at the H level at even time intervals and the periods when these signals at the H level are the same. However, the second embodiment is not limited to the clock signals which are at the H level at even time intervals. The sampling finish time of the clock signals ΦS1A, ΦS2A, ΦS1B, and ΦS2B are sampling time of the analog reference voltages VREFH, VREFL. Similarly to the above-mentioned first embodiment, it is also possible to arbitrarily adjust the analog FIR filter characteristic in the second embodiment by arbitrarily setting the cycle of the sampling.

In this situation, even if the jitters are nor applied on the clock signals ΦIA and ΦIB, the sampling time of the analog reference voltages VREFH, VREFL is not affected, and thus, the analog FIR filter characteristic is not affected at all.

Next, the effect of the second embodiment will be described. Herein, in order to facilitate the understanding of the description, there is firstly described a case where the jitters are applied to the conventional clock signals illustrated in FIGS. 27A and 27B, that is, a case where the jitters are applied to the sampling timings.

Applying the jitters to the sampling timings means the operation timings are changed dynamically in the timing charts of the FIGS. 27A and 27B. By applying the jitters to the sampling timings, it is possible to frequency-modulate the sampling operation.

By the frequency modulation of the sampling operation, it is possible to form the zero point of the frequency characteristic by a jitter amplitude (an absolute value of the change amount of the sampling edge in the time axis in FIGS. 13A to 13F).

Figure 14:
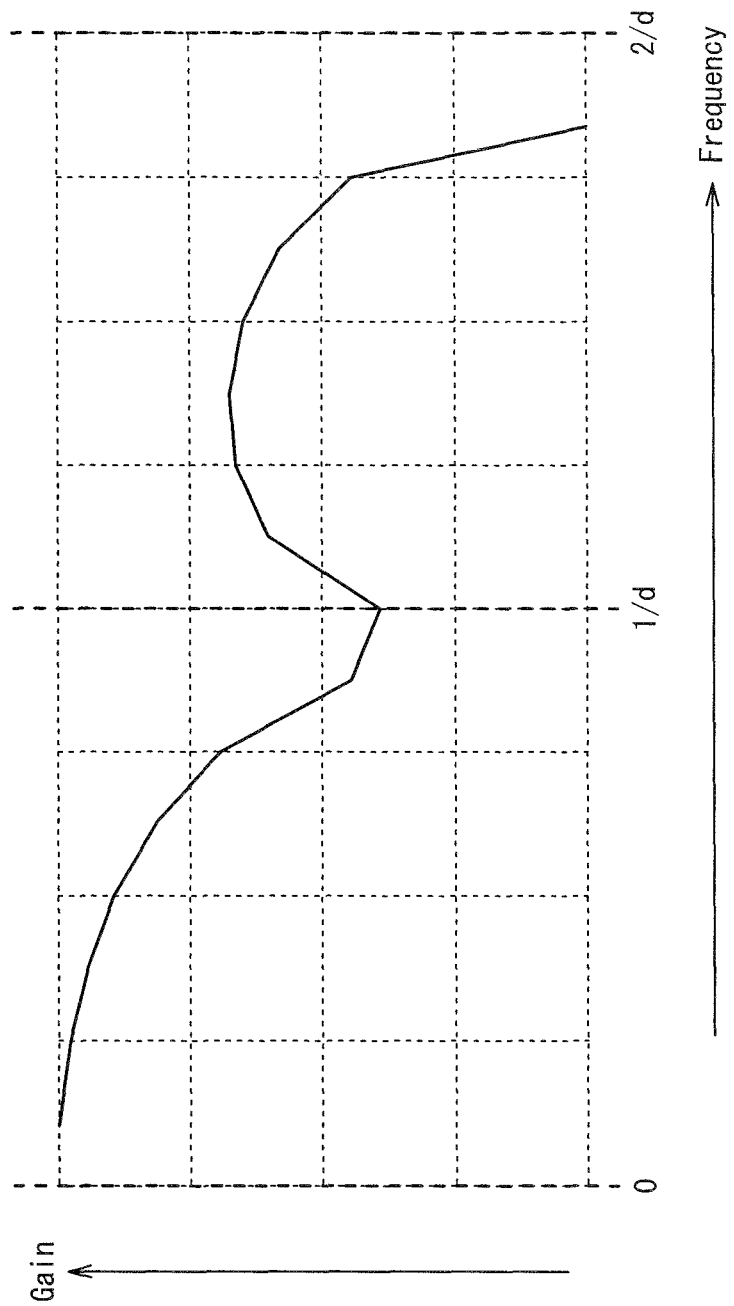
FIG. 14 is a view illustrating a frequency characteristic obtained by using clock signals illustrated in timing charts of FIGS. 13A to 13F.

The frequency FJ of the zero point formed by the frequency modulation by applying the jitters to the sampling timing is represented by the following expression (2).

$$FJ = (1/d) * I \; (I \text{ is a natural number}) \tag{2}$$

where, d denotes the jitter amplitude (e.g. d=(1/FS)*(1/M), m denotes the number of the sampling capacitors. FIG. 14 is a view illustrating a frequency characteristic modulated by applying the jitters to the sampling timings.

FIG. 14 illustrates the frequency characteristic obtained in a case where the sixteen sampling capacitors are provided in the sampling circuit 2 illustrated in FIG. 1 (M=16) and the clock signals illustrated in FIGS. 13A to 13F are supplied to the sampling circuit 2. FIG. 14 represents the frequency in abscissa and the gain in ordinate.

As illustrated in FIG. 14, it is possible to form the zero point at the frequency 1/d, by applying the jitters to the sampling timings in the sampling circuit 2. Furthermore, the frequency 1/d at which the zero point is formed is inversely proportional to the jitter amplitude. The zero point moves to the lower frequency side as the jitter amplitude is set to be larger, and the zero point moves to the higher frequency side as the jitter amplitude is set to be smaller.

Next, the operation of the D/A converter according to the second embodiment will be described.

The above-mentioned configuration of the second embodiment can be obtained by dividing the existing sampling capacitor into the plural capacitors, and by applying the jitters to the sampling timings as illustrated in FIGS. 13A to 13F.

Figure 15:
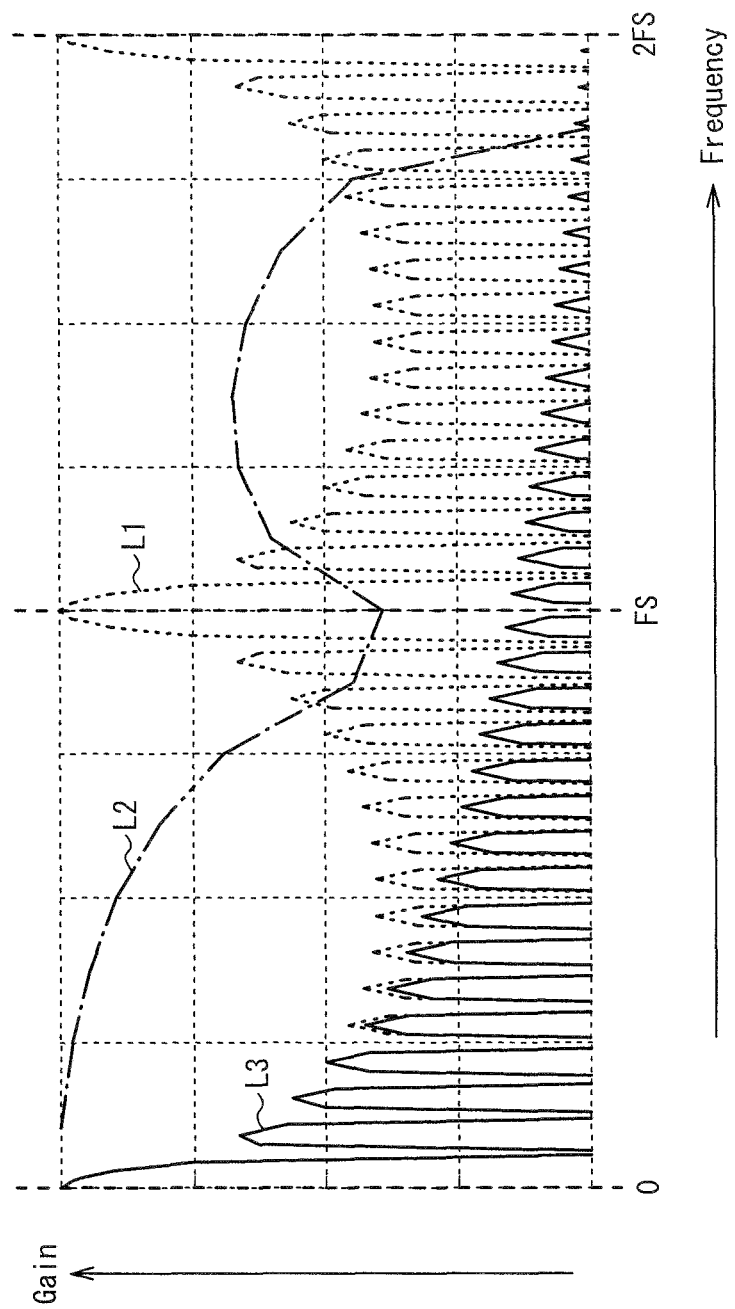
FIG. 15 is a view illustrating a frequency characteristic obtained in a sampling circuit 2 illustrated in FIG. 1 in a case where a sampling capacitor is divided and jitters are applied to edges of clock signals used in sampling.

FIG. 15 is a view illustrating the frequency characteristic obtained in the sampling circuit 2 illustrated in FIG. 1 in a case where the sampling capacitor is divided and the jitters are applied to the edges of the clock signals used in sampling. FIG. 15 illustrates the frequency characteristic in which the both of the effects of the analog FIR filter characteristic (the expression (1)) obtained by the divided sampling capacitor in the D/A converter 1 illustrated in FIG. 1 and of the frequency characteristic (the expression (2)) by the frequency modulation by applying the jitters to the sampling timings.

FIG. 15 represents the frequency in abscissa and the gain in ordinate. Furthermore, a characteristic line L1 illustrated in FIG. 15 represents the analog FIR filter characteristic (the expression (1)) and a characteristic line L2 represents the frequency characteristic by the frequency modulation. Furthermore, a characteristic like L3 represents an analog FIR filter characteristic obtained by both of the division of the existing sampling capacitor 905 and the frequency modulation by applying the jitters (i.e. a combined characteristics of the analog FIR filter characteristic (L1) and the frequency characteristic (L2) by the frequency modulation).

In the second embodiment, it is possible to form a zero point of the frequency characteristic, by adequately adjusting the jitter amplitude, at transmission regions which appear at integral multiples of the sampling frequency FS when dividing the sampling capacitor 905 as a region at which it is not possible to attenuate the gain "0 dB". That is, in the second embodiment, it is possible to obtain the frequency characteristic capable of attenuating the high frequency component in the wider band as illustrated in FIG. 15, by the frequency modulation by applying the jitters to the sampling timings.

It is possible in the second embodiment to obtain the frequency characteristic resulting in the effect of suppressing the high-frequency component, as illustrated in FIG. 15, by dividing the sampling capacitor into the plural capacitors and by applying the jitters to the sampling timings. Furthermore, in the second embodiment, it is possible to diffuse the radiation noise due to the inrush current in the analog part to suppress the radiation noise effectively. The effect of the second embodiment is obtained by including double number of sampling capacitors as compared with the existing sampling circuit 4 and by operating these sampling capacitors in a time division manner. Such a configuration can be considered as giving the frequency characteristic of the analog FIR filter to the sampling circuit itself.

Furthermore, in the second embodiment, although the sampling circuit increases in order to obtain the above-mentioned effect, the area and the noise do not increases.

Furthermore, in the second embodiment, it is possible to form the zero points of the frequency characteristic by the frequency modulation by applying the jitters on the sampling timings, by adequately adjusting the jitter amplitude, at the transmission regions which appear at the integral multiples of the sampling frequency FS at which it is not possible to attenuate the gain "0 dB" by the analog FIR filter characteristic. Therefore, in the second embodiment, it is possible to obtain the frequency characteristic capable of attenuating the high frequency component in the wider band as compared with the first embodiment, as illustrated in FIG. 15.

It is noted that it has been described in the second embodiment the case where the jitters are applied to both of the rising edges and the falling edges of the sampling signals, however, the second embodiment is not thereto. For example, even when the jitters are applied only to the falling edges of the sampling signals in the second embodiment, it is possible to frequency-modulate to form the zero point of the frequency characteristic. Furthermore, even when the jitters are applied only to the rising edges of the sampling signals in the second embodiment, it is possible to diffuse the radiation noise due to the inrush current in the analog part to suppress the radiation noise effectively.

Furthermore, in the first embodiment and the second embodiment, it is possible to change the frequency characteristic by changing the sampling timings or the capacitance ratios between the sampling capacitors, or by applying the jitters to the sampling timings, as mentioned above. Therefore, in the first embodiment and the second embodiment, it is possible to easily obtain a D/A converter with a desired frequency characteristic depending on the purpose of the D/A converter.

Third Embodiment

Figure 16:
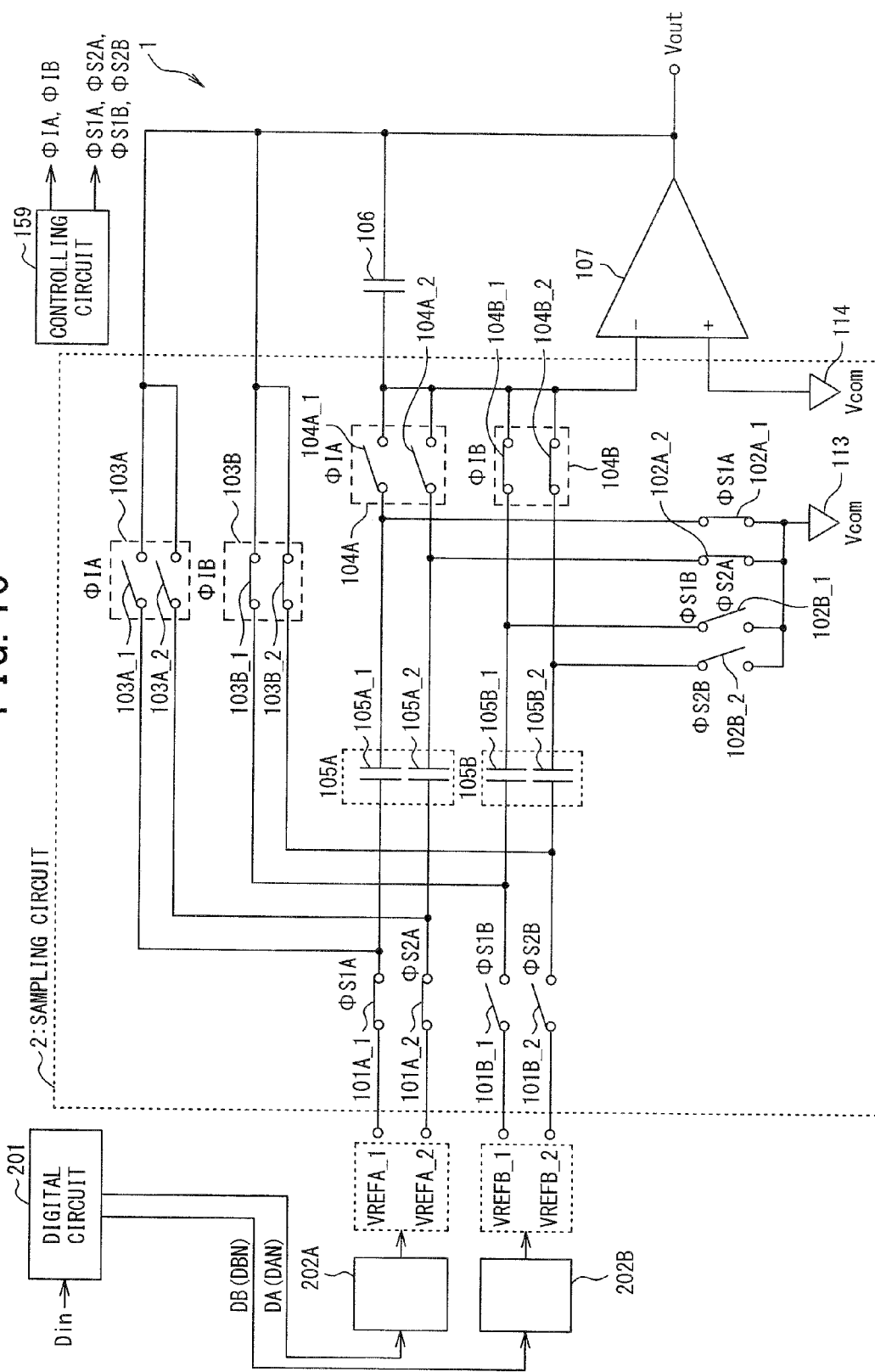
FIG. 16 is a circuit diagram illustrating a D/A converter according to the third embodiment of the present invention.

FIG. 16 is a circuit diagram illustrating a D/A converter according to the third embodiment of the present invention. FIG. 16 illustrates a configuration including the D/A converter 1 according to the first embodiment illustrated in FIG. 1, a digital circuit 201 generating the analog input signal inputted to the D/A converter 1, and switch circuits 202A and 202B. Among the components illustrated in FIG. 16, the components similar to those illustrated in FIG. 1 are assigned the same reference numerals and description thereof is omitted.

The digital signal Din is input to the digital circuit 201. The digital circuit 201 generates the digital code DA (DAN) and the digital code DB (DBN) from the digital signal Din, and output them to the switch circuits 202A and 202B. The switch circuits 202A and 202B are turned on and off by the digital code DA (DAN) and the digital code DB (DBN) and input the analog input signals VREFA_1, VREFA_2, VREFB_1, and VREFB_2 to the D/A converter 1. The switch circuits 202A and 202B are, for example, the switch circuits as illustrated in FIG. 2.

In the third embodiment, when the digital code issued from the digital circuit 201 is a K-valued code (K is a natural number ≤M), it is possible to suppress the increase in the capacitance of the sampling capacitors by inputting the K values to the sampling capacitor group including M/K sampling capacitors. That is, in the third embodiment, the plural digital codes are used as is in "CAP division" (i.e. division of the sampling capacitors) in a multi-bit D/A converter. Such a configuration can be used, for example, in a charge pump or the like.

Fourth Embodiment

FIG. 17 is a circuit diagram illustrating a D/A converter according to the fourth embodiment of the present invention. The D/A converter 11 according to the fourth embodiment includes a sampling circuit 22, the integration circuit including the integral capacity element 106 and the operational amplifier 107, the controlling circuit 159 configured to supply the clock for driving the sampling circuit 22, and the digital circuit 201 illustrated in FIG. 16, for example. It is to be noted that the digital circuit 201 is provided in the preceding stage of the D/A converter 11 illustrated in FIG. 17.

The D/A converter 11 according to the fourth embodiment includes the sampling circuit 22 to convert the inputted digital signal to the analog signal. The sampling circuit 22 includes the first capacitative element unit 105A, the second capacitative element unit 105B, and a third capacitative element unit 105C. The first capacitative element unit 105A includes the sampling capacitors 105A_1 and 105A_2 to store the charges generated by the digital code input by the digital circuit 201. The second capacitative element unit 105B includes the sampling capacitors 105B_1 and 105B_2 to store the charges generated by the digital code input by the digital circuit 201. The third capacitative element unit 105C includes sampling capacitors 105C_1 and 105C_2 to store the charges generated by the digital code input by the digital circuit 201.

Furthermore, the sampling circuit 22 includes the switch unit 104A, the switch unit 104B, and a switch unit 104C. The switch unit 104A includes the switches 104A_1 and 104A_2 for storing the charges in the sampling capacitors 105A_1 and 105A_2 of the first capacitative element unit 105A, respectively, as well as for transferring the stored charges. The switch unit 104B includes the plural switches 104B_1 and 104B_2 for storing the charges in the plural sampling capacitors 105B_1 and 105B_2 of the second capacitative element unit 105B, respectively, as well as for transferring the stored charges. The switch unit 104C includes switches 104C_1 and 104C_2 for storing the charges in the sampling capacitors 105C_1 and 105C_2, respectively, as well as for transferring the stored charges.

Furthermore, the D/A converter 11 illustrated in FIG. 17 includes the integral capacity element 106 to which the charges stored in the first capacitative element unit 105A, the second capacitative element unit 105B, and the third capacitative element unit 105C are transferred, and the operational amplifier 107 connected to the switch units 104A, 104B, and 104C. In the fourth embodiment, the switch unit 104A, the switch unit 104B, and the switch unit 104C operate in a given order, in the sampling circuit 22.

Furthermore, the sampling circuit 22 includes sampling capacitors 105A_1, 105A_2, 105B_1, 105B_2, 105C_1 and 105C_2, and switches 101A_1, 101A_2, 101B_1, 101B_2, 101C_1, 101C_2, 102A_1, 102A_2, 102B_1, 102B_2, 102C_1, 102C_2, 103A_1, 103A_2, 103B_1, 103B_2, 103C_1, 103C_2, 104A_1, 104A_2, 104B_1, 104B_2, 104C_1, and 104C_2.

The switch 101A_1, the sampling capacitor 105A_1 and the switch 102A_1 are connected to one another in series. The switch 101A_2, the sampling capacitor 105A_2 and the switch 102A_2 are connected to one another in series. Furthermore, the switch 103A_1, the sampling capacitor 105A_1 and the switch 104A_1 are connected to one another in series. The switch 103A_2, the sampling capacitor 105A_2 and the switch 104A_2 are connected to one another in series.

The switch 101B_1, the sampling capacitor 105B_1 and the switch 102B_1 are connected to one another in series. The switch 101B_2, the sampling capacitor 105B_2 and the switch 102B_2 are connected to one another in series. Furthermore, the switch 103B_1, the sampling capacitor 105B_1 and the switch 104B_1 are connected to one another in series. The switch 103B_2, the sampling capacitor 105B_2 and the switch 104B_2 are connected to one another in series.

The switch 101C_1, the sampling capacitor 105C_1 and the switch 102C_1 are connected to one another in series. The switch 101C_2, the sampling capacitor 105C_2 and the switch 102C_2 are connected to one another in series. Furthermore, the switch 103C_1, the sampling capacitor 105C_1 and the switch 104C_1 are connected to one another in series. The switch 103C_2, the sampling capacitor 105C_2 and the switch 104C_2 are connected to one another in series.

The switch 103A_1 and the switch 103A_2 constitute the switch unit 103A. The switch 103B_1 and the switch 103B_2 constitute the switch unit 103B. The switch 103C_1 and the switch 103C_2 constitute a switch unit 103C. The switch 104A_1 and the switch 104A_2 constitute the switch unit 104A. The switch 104B_1 and the switch 104B_2 constitute the switch unit 104_B. The switch 104C_1 and the switch 104C_2 constitute a switch unit 104C.

The switch 101A_1 is connected to the input terminal to which the analog input signal VREFA_1 is input. The switch 101A_2 is connected to the input terminal to which the analog input signal VREFA_2 is input. The switch 101B_1 is connected to the input terminal to which the analog input signal VREFB_1 is input. The switch 101B_2 is connected to the input terminal to which the analog input signal VREFB_2 is input. The switch 101C_1 is connected to an input terminal to which an analog input signal VREFC_1 is input. The switch 101C_2 is connected to an input terminal to which an analog input signal VREFC_2 is input. The switches 102A_1, 102A_2, 102B_1, 102B_2, 102C_1, and 102C_2 are connected to the terminal 113 to which the analog reference voltage Vcom is supplied.

The switch 103A_1 is connected between the output terminal of the operational amplifier 107 and the point between the switch 101A_1 and the sampling capacitor 105A_1. The switch 103A_2 is connected between the output terminal of the operational amplifier 107 and the point between the switch 101A_2 and the sampling capacitor 105A_2. The switch 103B_1 is connected between the output terminal of the operational amplifier 107 and the point between the switch 101B_1 and the sampling capacitor 105B_1. The switch 103B_2 is connected between the output terminal of the operational amplifier 107 and the point between the switch 101B_2 and the sampling capacitor 105B_2. The switch 103C_1 is connected between the output terminal of the operational amplifier 107 and a point between the switch 101C_1 and the sampling capacitor 105C_1. The switch 103C_2 is connected between the output terminal of the operational amplifier 107 and a point between the switch 101C_2 and the sampling capacitor 105C_2.

The one end of each of the switches 104A_1, 104A_2, 104B_1, 104B_2, 104C_1, and 104C_2 as the output of the sampling circuit 2 is connected to the one end of the integral capacity element 106 and the inverted input terminal of the operational amplifier 107.

The integral capacity element 106 is connected between the inverted input terminal and the output terminal of the operational amplifier 107. The non-inverted input terminal of the operational amplifier 107 is connected to the terminal 114 to which the analog voltage Vcom is supplied.

The respective switches are driven by the clock signals supplied from the controlling circuit 159 and perform on/off operation.

It is to be noted that the circuit having elements reference numerals of which are given "A", the circuit having elements reference numerals of which are given "B", and a circuit having elements reference numerals of which are given "C" have the same configuration in FIG. 17.

In FIG. 17, the capacitance of the sampling capacitor 105A_1 may equal to that of the sampling capacitor 105A_2. Similarly, the capacitance of the sampling capacitor 105B_1 may equal to that of the sampling capacitor 105B_2. Similarly, the capacitance of the sampling capacitor 105C_1 may equal to that of the sampling capacitor 105C_2.

The analog input signals VREFA_1, VREFA_2, VREFB_1, VREFB_2, VREFC_1, and VREFC_2 are input from the input terminal to the sampling circuit having the above-mentioned configuration.

The analog input signal VREFA_1 is sampled by the switch 102A_1. The charge is stored in the sampling capacitor 105A_1 by the sampling. Furthermore, the analog input signal VREFA_2 is sampled by the switch 102A_2. The charge is stored in the sampling capacitor 105A_2 by the sampling.

Similarly, the analog input signal VREFB_1 is sampled by the switch 102B_1. The charge is stored in the sampling capacitor 105B_1 by the sampling. Furthermore, the analog input signal VREFB_2 is sampled by the switch 102B_2. The charge is stored in the sampling capacitor 105B_2 by the sampling.

Similarly, the analog input signal VREFC_1 is sampled by the switch 102C_1. The charge is stored in the sampling capacitor 105C_1 by the sampling. Furthermore, the analog input signal VREFC_2 is sampled by the switch 102C_2. The charge is stored in the sampling capacitor 105C_2 by the sampling.

The input terminals to which the analog input voltages VREFA_1, VREFA_2 illustrated in FIG. 17 are input are also connected to a switch circuit similar to the circuit illustrated in FIG. 2. The switch circuits 1401 and 1402 are turned on and off by the digital codes DA, DAN issued from, for example, the digital circuit 201 illustrated in FIG. 16.

Furthermore, the input terminals to which the analog input voltages VREFB_1, VREFB_2 illustrated in FIG. 17 are input are also connected to a switch circuit similar to the circuit illustrated in FIG. 2. The switches 1401 and 1402 illustrated in FIG. 2 are turned on and off by the digital codes DB, DBN issued from the digital circuit 201.

Furthermore, the input terminals to which the analog input voltages VREFC_1, VREFC_2 illustrated in FIG. 17 are input are also connected to a switch circuit similar to the circuit illustrated in FIG. 2. The switches 1401 and 1402 illustrated in FIG. 2 are turned on and off by the digital codes DC, DCN issued from the digital circuit 201.

Next, the operation of the D/A converter 11 illustrated in FIG. 17 will be described.

In the fourth embodiment, it is assumed that the digital codes DA, DB, and DC applied to the switch circuits illustrated in FIG. 2 are at the H level. That is, there is described in the fourth embodiment, a case where the analog reference voltage VREFH is supplied to all the input terminals to which the analog input signals VREFA_1, VREFA_2, VREFB_1, VREFB_2, VREFC_1, and VREFC_2 in FIG. 17.

However, the fourth embodiment of the present invention is not limited to the case where the digital codes DA, DB, and DC are at the H level, and the analog reference voltage VREFH is supplied to all the input terminals to which the analog input signals VREFA_1, VREFA_2, VREFB_1, VREFB_2, VREFC_1, and VREFC_2.

The switches 101A_1, 101A_2, 101B_1, 101B_2, 101C_1, 101C_2, 102A_1, 102A_2, 102B_1, 102B_2, 102C_1, 102C_2, 103A_1, 103A_2, 103B_1, 103B_2, 103C_1, 103C_2, 104A_1, 104A_2, 104B_1, 104B_2, 104C_1, and 104C_2 store the charges in the sampling capacitors 105A_1, 105A_2, 105B_1, 105B_2, 105C_1, and 105C_2 in accordance with the switching.

Furthermore, the charges stored in the sampling capacitors 105A_1, 105A_2, 105B_1, and 105B_2 are transferred to the integral capacity element 106 by the switching of the switches 101A_1, 101A_2, 101B_1, 101B_2, 101C_1, 101C_2, 102A_1, 102A_2, 102B_1, 102B_2, 102C_1, 102C_2, 103A_1, 103A_2, 103B_1, 103B_2, 103C_1, 103C_2, 104A_1, 104A_2, 104B_1, 104B_2, 104C_1, and 104C_2.

The operational amplifier 107 receives the analog reference voltage Vcom at the non-inverted input terminal and outputs the analog output signal Vout from the output terminal.

The above-described sampling circuit illustrated in FIG. 17 includes plural of sampling capacitors (the six sampling capacitors 105A_1, 105A_2, 105B_1, 105B_2, 105C_1 and 105C_2 in the example illustrated in FIG. 17).

The amount of the charge stored in the sampling capacitor 105A_1 is set by the switching operation of the switches 101A_1 and 102A_1. The amount of the charge stored in the sampling capacitor 105A_2 is set by the switching operation of the switches 101A_2 and 102A_2.

The amount of the charge stored in the sampling capacitor 105B_1 is set by the switching operation of the switches 101B_1 and 102B_1. The amount of the charge stored in the sampling capacitor 105B_2 is set by the switching operation of the switches 101B_2 and 102B_2.

The amount of the charge stored in the sampling capacitor 105C_1 is set by the switching operation of the switches 101C_1 and 102C_1. The amount of the charge stored in the sampling capacitor 105C_2 is set by the switching operation of the switches 101C_2 and 102C_2.

It is to be noted that the number of the sampling capacitors 105A_1, 105A_2, 105B_1, 105B_2, 105C_1, and 105C_2 of the sampling circuit according to the fourth embodiment is not limited to six, obviously, and has only to be M*3, where M is a natural number.

In the sampling circuit 22 illustrated in FIG. 17, the number of the switches increases as the number M*3 of the sampling capacitors increases. Furthermore, the number of the clock signals driving the switches increases as the number M*3 of the sampling capacitors increases. It is to be noted that even if the number of the sampling capacitors increases, the configuration illustrated in FIG. 17 other than the sampling circuit will not change.

Furthermore, when additional sampling capacitors are added to the sampling circuit 22 illustrated in FIG. 17, the sum of the capacitances of the sampling capacitors after the addition may equal to the sum of the capacitances of the sampling capacitors 105A_1, 105A_2, 105B_1, 105B_2, 105C_1, and 105C_2. By configuring the sampling circuit 22 such that the sum of the capacitances of the sampling capacitors included therein does not change before and after the addition of the sampling capacitors, and by adequately allocating the capacitance of the sampling capacitors included in the sampling circuit including the added sampling capacitors and the operating timing, it is possible in the fourth embodiment to form the analog FIR filter capable of reducing the gain at the specific frequency included in the output signal Vout.

Furthermore, in the fourth embodiment, the switch 101A_1 and the switch 102A_1 are driven by the clock signal $\Phi$S1A, and the switch 101A_2 and the switch 102A_2 are driven by the clock signal $\Phi$S2A, as illustrated in FIG. 17. Furthermore, the switch 101B_1 and the switch 102B_1 are driven by the clock signal $\Phi$S1B, and the switch 101B_2 and the switch 102B_2 are driven by the clock signal $\Phi$S2B. Furthermore, the switch 101C_1 and the switch 102C_1 are driven by a clock signal $\Phi$S1C, and the switch 101C_2 and the switch 102C_2 are driven by a clock signal $\Phi$S2C.

Furthermore, the switches 103A_1, 103A_2, 104A_1 and 104A_2 are driven by the clock signal $\Phi$IA. The switches 103B_1, 103B_2, 104B_1 and 104B_2 are driven by the clock signal $\Phi$IB. Furthermore, the switches 103C_1, 103C_2, 104C_1 and 104C_2 are driven by a clock signal $\Phi$IC.

FIGS. 18A to 18Q are timing charts of clock signals input to and output from the D/A converter 11 illustrated in FIG. 17. The clock signals $\Phi$S1A, $\Phi$S2A, $\Phi$IA, $\Phi$S1B, $\Phi$S2B, $\Phi$IB, $\Phi$S1C, $\Phi$S2C, and $\Phi$IC are turned on and off at the timings illustrated in FIGS. 18A to 18I, respectively. It is to be noted that FIG. 18A illustrates the clock signal $\Phi$S1A, FIG. 18B illustrates the clock signal $\Phi$S2A, FIG. 18C illustrates the clock signal $\Phi$IA, FIG. 18D illustrates the clock signal $\Phi$S1B, FIG. 18E illustrates the clock signal $\Phi$S2B, FIG. 18F illustrates the clock signal $\Phi$IB, FIG. 18G illustrates the clock signal ΦS1C, FIG. 18H illustrates the clock signal ΦS2C, and FIG. 18I illustrates the clock signal ΦIC.

Furthermore, FIG. 18J illustrates a digital signal Din, FIG. 18K illustrates the digital code DA (DAN), FIG. 18L illustrates the digital code DB (DBN), FIG. 18M illustrates the digital code DC (DCN), FIG. 18N illustrates the analog data VA, FIG. 18O illustrates the analog data VB, FIG. 18P illustrates an analog data VC, and FIG. 18Q illustrates the output signal Vout.

As illustrated in FIGS. 18A to 18I, the clock signal ΦS1A, the clock signal ΦS2A, the clock signal ΦS1B, the clock signal ΦS2B, the clock signal ΦS1C and the clock signal ΦS2C are at the H level in periods with the same length. And the clock signal ΦS1A, ΦS1B, and ΦS1C become the H level in turn one by one. Furthermore, the clock signal ΦS2A, ΦS2B, and ΦS2C become the H level in turn one by one.

Furthermore, the clock signal ΦIA is at the H level within the period (the non-storing period of the first switching element) from the falling edge of the clock signal ΦS2A to the next rising edge of the clock signal ΦS1A. The clock signal ΦIA is set such that the integrate timing which is the timing when the charges stored in the sampling capacitors 105A_1 and 105A_2 are transferred to the integral capacity element 106 comes within the period from the falling edge of the clock signal ΦS2A to the next rising edge of the clock signal ΦS1A.

Similarly, the clock signal ΦIB is at the H level within the period (the non-storing period of the second switching element) from the falling edge of the clock signal ΦS2B to the next rising edge of the clock signal ΦS1B. The clock signal ΦIB is set such that the integrate timing which is the timing when the charges stored in the sampling capacitors 105B_1 and 105B_2 are transferred to the integral capacity element 106 comes within the period from the falling edge of the clock signal ΦS2B to the next rising edge of the clock signal ΦS1B.

Similarly, the clock signal ΦIC is at the H level within a period (a non-storing period of the second switching element) from the falling edge of the clock signal ΦS2C to the next rising edge of the clock signal ΦS1C. The clock signal ΦIC is set such that an integrate timing which is a timing when the charges stored in the sampling capacitors 105C_1 and 105C_2 are transferred to the integral capacity element 106 comes within the period from the falling edge of the clock signal ΦS2C to the next rising edge of the clock signal ΦS1C.

As illustrated in FIGS. 18C, 18F, and 18I, the clock signals ΦIA, ΦIB, and ΦIC become the H level in turn one by one. The clock signals ΦIA, ΦIB, and ΦIC determines the timings of transferring the charges stores in the sampling capacitors to the integral capacity element 106, and thus determines an output signal generation timing of the D/A converter.

That is, the switch unit 104A stores the charges in the plural sampling capacitors 105A_1 and 105A_2 of the first capacitative element unit 105A within the period when the switch unit 104B transfers the charges stored in the sampling capacitors 105B_1 and 105B_2 and the period when the switch unit 104C transfers the charges stored in the sampling capacitors 105C_1 and 105C_2. The charges are stored in accordance with the plural clock signals which are set such that the respective sampling timings of storing the charges in the sampling capacitors 105A_1 and 105A_2 of the first capacitative element unit 105A are different from each other.

Furthermore, the switch unit 104B stores the charges in the plural sampling capacitors 105B_1 and 105B_2 of the second capacitative element unit 105B within the period when the switch unit 104A transfers the charges stored in the sampling capacitors 105A_1 and 105A_2 and within the period when the switch unit 104C transfers the charges stored in the sampling capacitors 105C_1 and 105C_2. The charges are stored in accordance with the plural clock signals which are set such that the respective sampling timings of storing the charges in the plural sampling capacitors 105B_1 and 105B_2 of the second capacitative element unit 105B are different from each other.

Furthermore, the switch unit 104C stores the charges in the sampling capacitors 105C_1 and 105C_2 of the third capacitative element unit 105C within the period when the switch unit 104A transfers the charges stored in the sampling capacitors 105A_1 and 105A_2 and within the period when the switch unit 104B transfers the charges stored in the sampling capacitors 105B_1 and 105B_2. The charges are stored in accordance with the plural clock signals which are set such that the respective sampling timings of storing the charge in the plural sampling capacitors 105C_1 and 105C_2 of the third capacitative element unit 105C are different from each other.

Furthermore, in the fourth embodiment, the charge stored in any one of the capacitative element units is always transferred by switching the three periods including the period of transferring the charge stored in the first capacitative element unit 105A, the period of transferring the charge stored in the second capacitative element unit 105B, and the period of transferring the charge stored in the third capacitative element unit 105B, in a given order.

Furthermore, the digital signal Din includes the digital codes. For example, the digital circuit 201 illustrated in FIG. 16 outputs the digital codes DA (DAN) which are the zeroth, third, sixth, . . . codes in the digital signal Din, and outputs the digital codes DB (DBN) which are the first, fourth, seventh, . . . codes in the digital signal Din. Furthermore, the digital circuit 201 outputs the digital codes DC (DCN) which are the second, fifth, eighth, . . . codes in the digital signal Din. Hereinafter, D[i] denotes the digital code DA (DAN), where i=0, 3, 6, . . . , and D[j] denotes the digital code DB (DBN), where j=1, 4, 7, . . . , and D[k] denotes the digital code DC (DCN), where k=2, 5, 8, . . . .

When the clock signal ΦS1A becomes the H level, the digital code D[0] is sampled by the switches 101A_1 and 102A_1. The charge is stored in the sampling capacitor 105A_1 by the sampling. When the clock signal ΦS2A becomes the H level, the digital code D[0] is sampled by the switches 101A_2 and 102A_2. The charge is stored in the sampling capacitor 105A_2 by the sampling.

When the clock signal ΦIA becomes the H level, the charges stored in the sampling capacitors 105A_1 and 105A_2 are transferred to the integral capacity element 106 by the switches 103A_1, 103A_2, 104A_1, and 104A_2. When the transferred charge is considered as the analog data VA for the sake of convenience, the analog data VA is represented as A[0].

Similarly, when the clock signal ΦS1B becomes the H level, the digital code D[1] is sampled by the switches 101B_1 and 102B_1. The charge is stored in the sampling capacitor 105B_1 by the sampling. when the clock signal ΦS2B becomes the H level, the digital code D[1] is sampled by the switches 101B_2 and 102B_2. The charge is stored in the sampling capacitor 105B_2 by the sampling.

When the clock signal ΦIB becomes the H level, the charges stored in the sampling capacitors 105B_1 and 105B_2 are transferred to the integral capacity element 106 by the switches 103B_1, 103B_2, 104B_1, and 104B_2. When the transferred charge is considered as the analog data VB for the sake of convenience, the analog data VB is represented as A[1].

Similarly, when the clock signal ΦS1C becomes the H level, the digital code D[2] is sampled by the switches 101C_1 and 102C_1. The charge is stored in the sampling capacitor 105C_1 by the sampling. When the clock signal ΦS2C becomes the H level, the digital code D[2] is sampled by the switches 101B_C and 102B_C. The charge is stored in the sampling capacitor 105C_2 by the sampling.

When the clock signal ΦIC becomes the H level, the charges stored in the sampling capacitors 105C_1 and 105C_2 are transferred to the integral capacity element 106 by the switches 103C_1, 103C_2, 104C_1, and 104C_2. When the transferred charge is considered as the analog data VC for the sake of convenience, the analog data VC is represented as A[2].

In the first embodiment, the switch unit 104A, the switch unit 104B, and the switch unit 103C are configured to operate sequentially and repeatedly. Therefore, the charges of the analog data VA, VB, VC are transferred to the integral capacity element 106 in turn, and are output from the output terminal of the operational amplifier 107 as the output signal Vout.

In the above-mentioned configuration, the switch unit 104A, the switch unit 104B, and the switch unit 103C are configured to operate in a given order. However, the fourth embodiment is not limited to such a configuration. That is, in the fourth embodiment, the switch unit 104A, the switch unit 104B, and the switch unit 104C may operate in an order with a specific regularity, periodically. In other words, these switch units may operate sequentially in turn.

The D/A converter 11 according to the fourth embodiment illustrated in FIG. 17 includes plural divided sampling capacitors and includes three sets (i.e. triple of conventional ones) of circuits using plural sampling timings. The D/A converter 11 can obtain the analog FIR filter characteristic by causing the three sets of circuits to perform the time-interleave operation. That is, the circuit having elements reference numerals of which are given "A", the circuit having elements reference numerals of which are given "B", and the circuit having elements reference numerals of which are given "C" in FIG. 17 have the same configuration and perform the sampling operations in a given order, to result in the analog FIR characteristic. It is to be noted that FIG. 17 illustrates the case where M=2.

Furthermore, the fourth embodiment is not limited to the configuration in which the capacitance of the sampling capacitor 905 illustrated in FIG. 26 is divided to M even capacitances. It is possible in the fourth embodiment to arbitrarily adjust the frequency characteristic of the obtained analog FIR characteristic by arbitrarily adjusting the capacitances of M sampling capacitors.

(First Specific Example of Analog FIR Characteristic)

FIGS. 18A to 18I are timing charts of clock signals supplied to the D/A converter 11 illustrated in FIG. 17. The reference symbol T in FIGS. 18A to 18Q represents the cycle (T=1/FS) of the clock signal. In the timing charts illustrated in FIGS. 18A to 18I, any one of the clock signal ΦS1A, the clock signal ΦS2A, the clock signal ΦS1B, and the clock signal ΦS2B becomes the H level at even time intervals, and they are at the H level at time intervals of the same length. That is, the sampling timing of the sampling capacitors 105A_1, 105A_2, 105B_1, and 105B_2 is set by the falling edge of the clock signals ΦS1A, ΦS2A, ΦS1B, and ΦS2B. Therefore, the sampling timing of the sampling capacitors 105A_1, 105A_2, 105B_1, and 105B_2 is set to come at even intervals.

In the examples of the timing charts illustrated in FIGS. 18A to 18I, the charges sampled by the clock signal ΦS1A and the clock signal ΦS2A are transferred at the timing of the clock signal ΦIA to generate the output signal. In this case, the output signal is an average value of the two signals sampled at a cycle T/2 (2FS), where T is the sampling cycle. Accordingly, it turns out that the analog FIR filter is applied to the sampled signals in the fourth embodiment.

Figure 19:
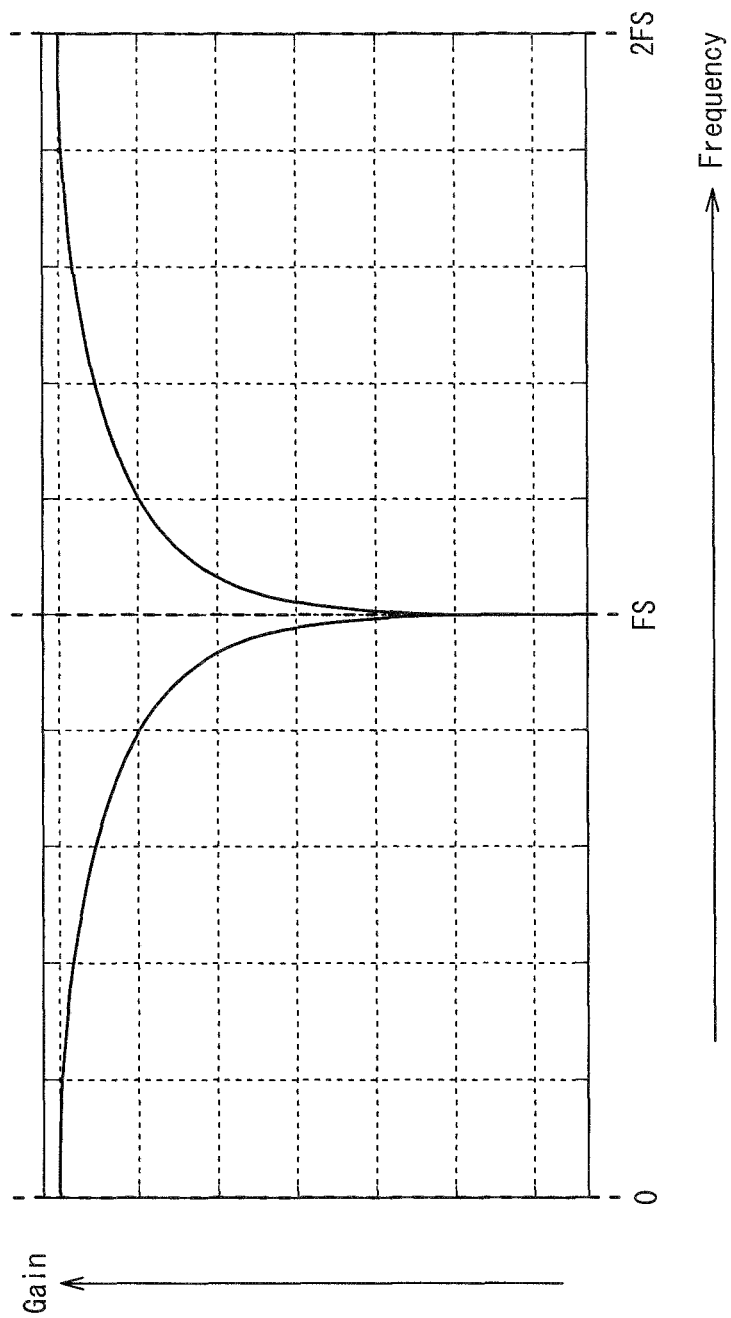
FIG. 19 is a view illustrating a analog FIR characteristic obtained in a case where clock signals illustrated in timing charts of FIGS. 18A to 18I are supplied to sampling capacitors in a D/A converter illustrated in FIG. 17.
Figure 20:
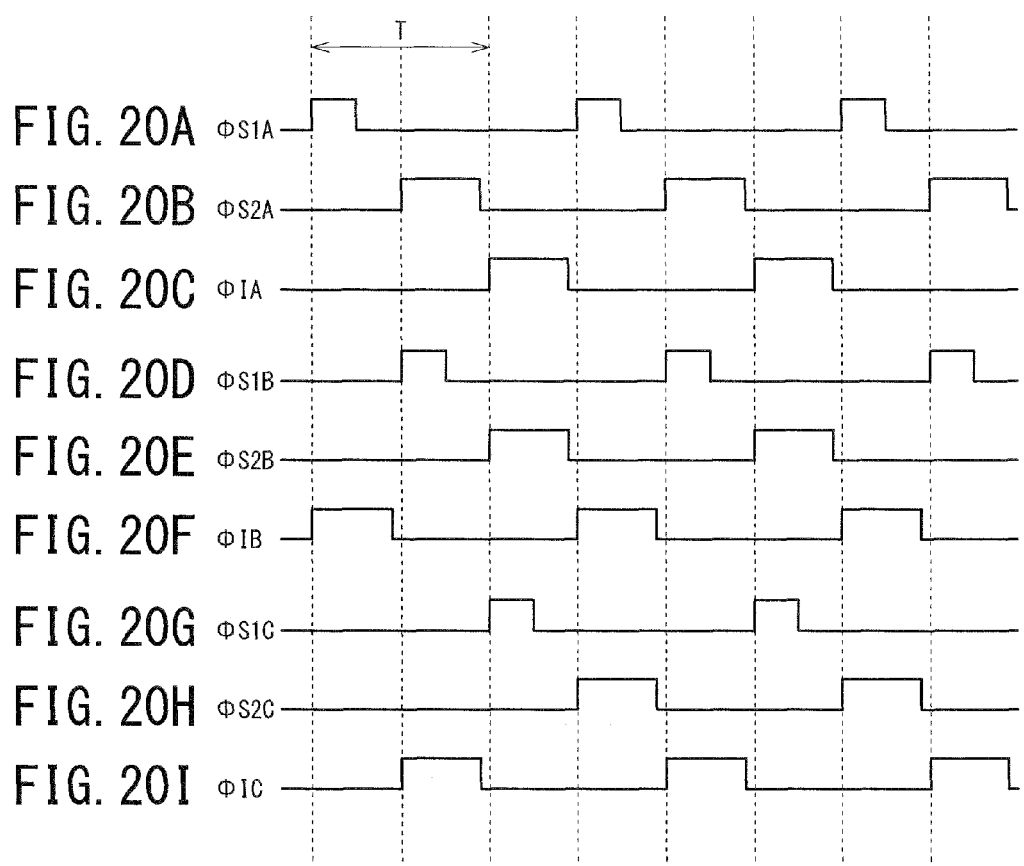
FIGS. 20A to 20I are timing charts of other clock signals supplied to a D/A converter illustrated in FIG. 17.

FIG. 19 is a view illustrating the analog FIR characteristic obtained in a case where the clock signals illustrated in the timing charts of FIGS. 18A to 18I are supplied to the sampling capacitors 105A_1, 105A_2, 105B_1, 105B_2, 105C_1, and 105C_2 in the D/A converter 11 illustrated in FIG. 17. It is to be noted that the capacitance ratios between the sampling capacitors are set as the sampling capacitor 105A_1:the sampling capacitor 105A_2=1:1, the sampling capacitor 105B_1:the sampling capacitor 105B_2=1:1, and the sampling capacitor 105C_1:the sampling capacitor 105C_2=1:1.

FIG. 19 represents the frequency in abscissa and the gain in ordinate. As illustrated in FIG. 19, it turns out that the gain becomes substantially zero rapidly at the sampling frequency FS. That is, the FIR filter characteristic illustrated in FIG. 19 corresponds to a two tap FIR filter characteristic with a filter operation frequency 2FS. Therefore, it turns out that the D/A converter 11 according to the fourth embodiment is capable of obtaining the analog FIR characteristic with a great attenuation effect at the sampling frequency FS.

Furthermore, in the fourth embodiment, the output signal generated at the timing of the clock signal ΦIB is obtained by sampling with the clock signal ΦS1B and the clock signal ΦS2B. Therefore, the output signal is an average value of the two signals sampled at a cycle T/2 (2FS), where T is the sampling cycle. Accordingly, it turns out that the analog FIR filter is applied to the sampled signals in the fourth embodiment.

Similarly, the output signal generated at the timing of the clock signal ΦIC is obtained by sampling with the clock signal ΦS1C and the clock signal ΦS2C. Therefore, the output signal is an average value of the two signals sampled at a cycle T/2 (2FS), where T is the sampling cycle. Accordingly, it turns out that the analog FIR filter is applied to the sampled signals in the fourth embodiment.

(Second Specific Example of Analog FIR Characteristic)

The respective clock signals according to the fourth embodiment are not limited to the signals illustrated in the timing charts of FIGS. 18A to 18I. For example, with respect to the clock signals in the four embodiment, the clock signal ΦS1A and the clock signal ΦIA or the clock signal ΦS2A and the clock signal ΦIA may be the non-overlap clock signals, which are not at the H level at the same time. The clock signal ΦS1B and the clock signal ΦIB or the clock signal ΦS2B and the clock signal ΦIB may be the non-overlap clock signals, which are not at the H level at the same time. And the clock signal ΦS1C and the clock signal ΦIC or the clock signal ΦS2C and the clock signal ΦIC may be the non-overlap clock signals, which are not at the H level at the same time.

Furthermore, in the fourth embodiment, the analog FIR characteristic may be arbitrarily adjusted by arbitrarily setting the intervals of the sampling timings within ranges satisfy a condition that the relationship among the clock signal ΦS1A, the clock signal ΦS2A and the clock signal ΦIA, the relationship among the clock signal ΦS1B, the clock signal ΦS2B and the clock signal ΦIB, and the relationship among the clock signal ΦS1C, the clock signal ΦS2C and the clock signal ΦIC are the same.

FIGS. 20A to 20I are timing charts of other clock signals supplied to the D/A converter 11 illustrated in FIG. 17. The timing charts illustrated in FIGS. 20A to 20I are obtained by reducing the sampling periods of the clock signal ΦS1A, the clock signal ΦS1B, the clock signal ΦS1C illustrated in FIGS. 18A, 18D, and 18G to half, and by advancing the sampling timings of the clock signal ΦS1A, the clock signal ΦS1B, and the clock signal ΦS1C by the quarter of the cycle.

Figure 21:
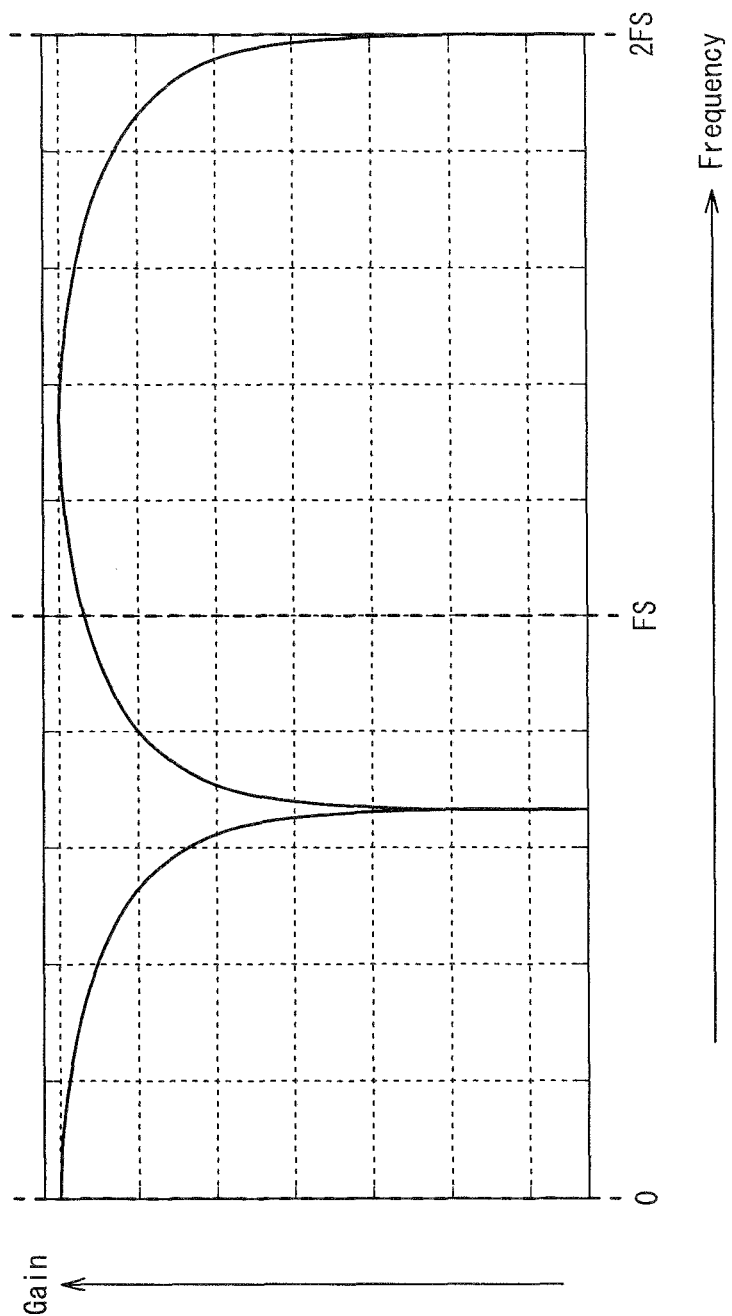
FIG. 21 is a view illustrating a analog FIR characteristic obtained in a case where clock signals illustrated in timing charts of FIGS. 20A to 20I are supplied to a D/A converter illustrated in FIG. 17.
Figure 22:
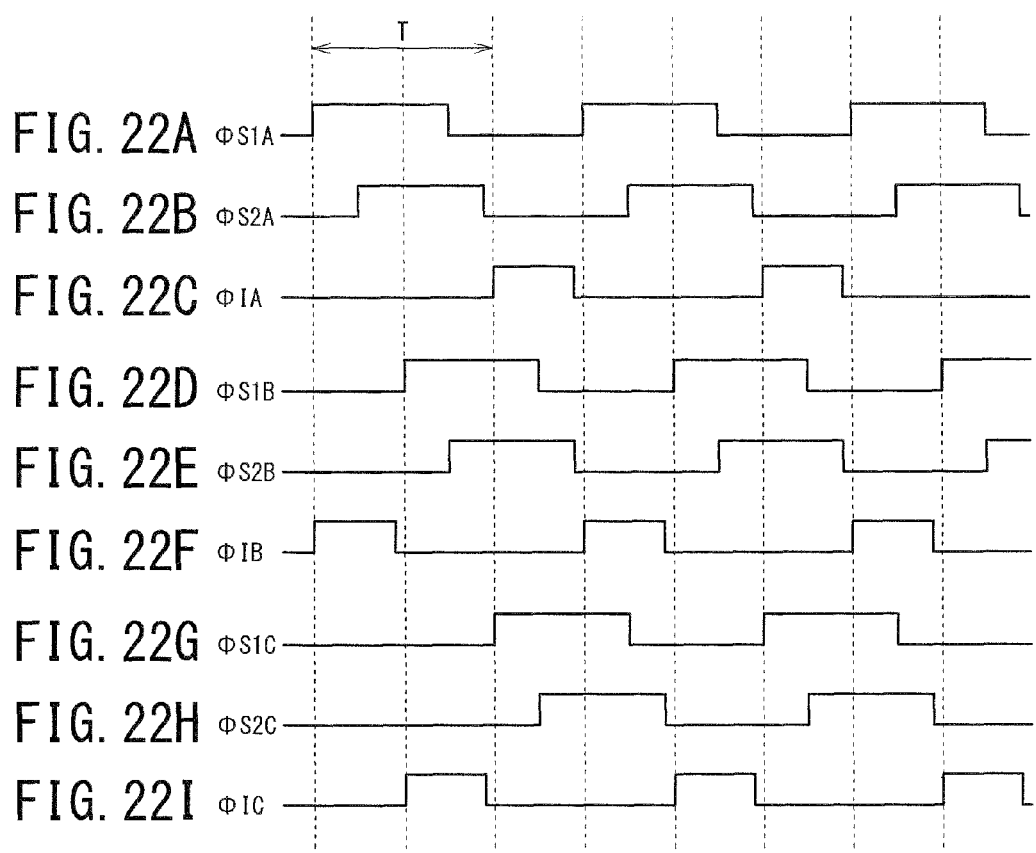
FIGS. 22A to 22I are timing charts of other clock signals supplied to a D/A converter illustrated in FIG. 17.

FIG. 21 is a view illustrating an analog FIR characteristic obtained in a case where the clock signals illustrated in the timing charts of FIGS. 20A to 20I are supplied to the sampling capacitors 105A_1, 105A_2, 105B_1, 105B_2, 105C_1, and 105C_2 in the D/A converter 11 illustrated in FIG. 17. It is to be noted that the capacitance ratios between the sampling capacitors are set as the sampling capacitor 105A_1:the sampling capacitor 105A_2=1:1, the sampling capacitor 105B_1:the sampling capacitor 105B_2=1:1, and the sampling capacitor 105C_1:the sampling capacitor 105C_2=1:1.

FIG. 21 represents the frequency in abscissa and the gain in ordinate. As illustrated in FIG. 21, the gain becomes substantially zero rapidly at a frequency lower than the sampling frequency FS and the frequency 2FS being double of the sampling frequency FS. Therefore, it turns out that the analog FIR characteristic with a great attenuation effect is obtained in the fourth embodiment.

(Third Specific Example of Analog FIR Characteristic)

FIGS. 22A to 22I are timing charts of other clock signals supplied to the D/A converter 11 illustrated in FIG. 17. The timing charts illustrated in FIGS. 22A to 22I are obtained by extending the sampling periods of the clock signal ΦS1A, the clock signal ΦS2A, the clock signal ΦS1B, the clock signal ΦS2B, the clock signal ΦS1C, and the clock signal ΦS2C illustrated in FIGS. 18A, 18B, 18D, 18E, 18G, and 18H to 1.5 times, and by delaying the sampling timings of the clock signal ΦS1A, the clock signal ΦS2A, the clock signal ΦS1B, the clock signal ΦS2B, the clock signal ΦS1C, and the clock signal ΦS2C by the quarter of the cycle.

Figure 23:
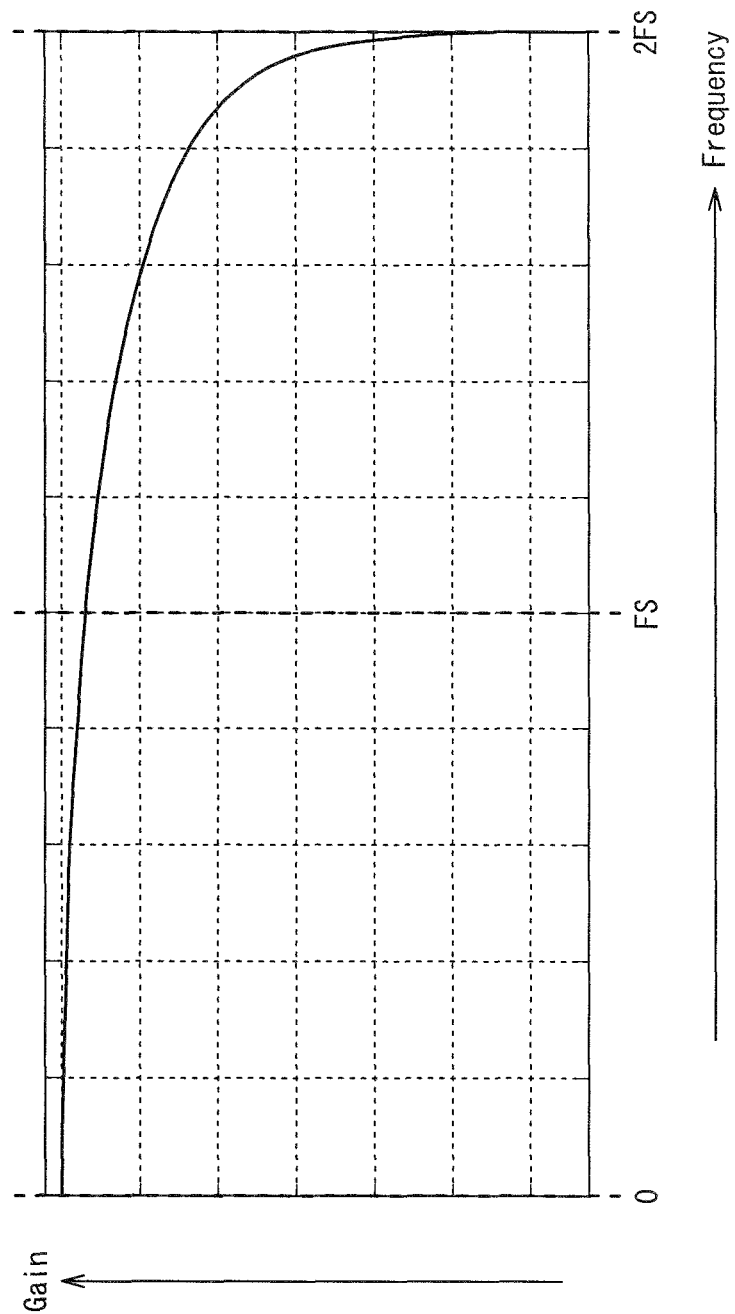
FIG. 23 is a view illustrating a analog FIR characteristic obtained in a case where clock signals illustrated in timing charts of FIGS. 22A to 22I are supplied to sampling capacitors in a D/A converter illustrated in FIG. 17.

FIG. 23 is a view illustrating an analog FIR characteristic obtained in a case where clock signals illustrated in timing charts of FIGS. 22A to 22I are supplied to sampling capacitors 105A_1, 105A_2, 105B_1, 105B_2, 105C_1, and 105C_2 in the D/A converter 11 illustrated in FIG. 17. It is to be noted that the capacitance ratios between the sampling capacitors are set as the sampling capacitor 105A_1:the sampling capacitor 105A_2=1:1, the sampling capacitor 105B_1:the sampling capacitor 105B_2=1:1, and the sampling capacitor 105C_1:the sampling capacitor 105C_2=1:1.

FIG. 23 represents the frequency in abscissa and the gain in ordinate. As illustrated in FIG. 23, the gain is relatively large at the sampling frequency FS and becomes substantially zero at the frequency 2FS being double of the sampling frequency FS. Therefore, it turns out that the D/A converter 11 according to the fourth embodiment is capable of obtaining the analog FIR characteristic with a great attenuation effect.

(Fourth Specific Example of Analog FIR Characteristic)

Furthermore, as mentioned above, when the sampling capacitor is divided into plural capacitors, the fourth embodiment is not limited to the configuration in which the capacitance of the sampling capacitor 905 illustrated in FIG. 26 is divided to M even capacitances. It is possible in the fourth embodiment to arbitrarily adjust the frequency characteristic of the obtained analog FIR characteristic by arbitrarily adjusting the capacitances of M sampling capacitors.

Figure 24:
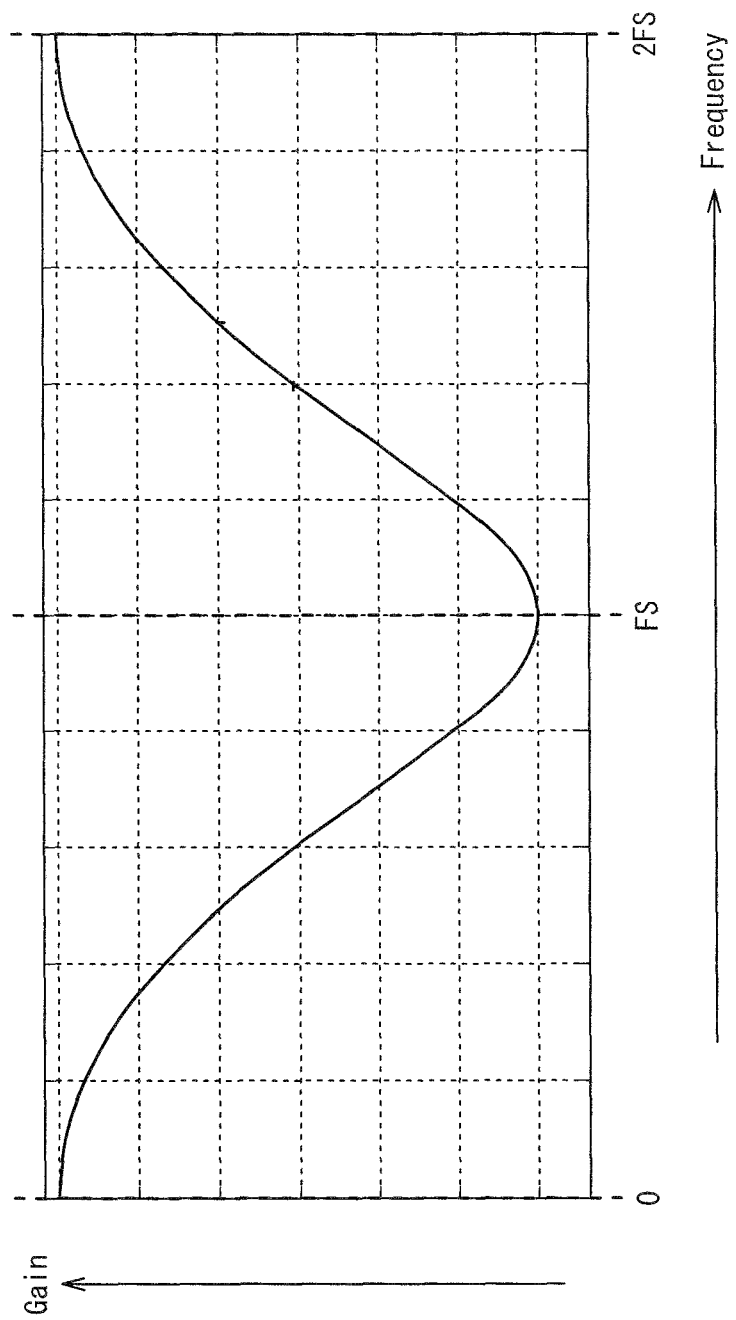
FIG. 24 is a view illustrating a frequency characteristic in a case where capacitance ratios between sampling capacitors are changed in a sampling circuit having an analog FIR characteristic illustrated in FIG. 19.

FIG. 24 is a view illustrating the frequency characteristic in a case where the capacitance ratios between sampling capacitors are changed in the sampling circuit having the analog FIR characteristic illustrated in FIG. 19. The frequency characteristic illustrated in FIG. 24 is the analog FIR characteristic obtained in a case where the capacitance ratios between the sampling capacitors of the D/A converter 11 illustrated in FIG. 17 are set as the sampling capacitor 105A_1:the sampling capacitor 105A_2=3:1, the sampling capacitor 105B_1:the sampling capacitor 105B_2=3:1, and the sampling capacitor 105C_1:the sampling capacitor 105C_2=3:1, and the clock signals illustrated in timing charts of FIGS. 18A to 18I are supplied to the sampling capacitors 105A_1, 105A_2, 105B_1, 105B_2, 105C_1, and 105C_2.

FIG. 24 represents the frequency in abscissa and the gain in ordinate. As illustrated in FIG. 24, the gain changes sinusoidally as the frequency increases, reaches a minimum near the sampling frequency FS, and reaches a maximum near the frequency 2FS being double of the sampling frequency FS.

(Fifth Specific Example of Analog FIR Characteristic)

Figure 25:
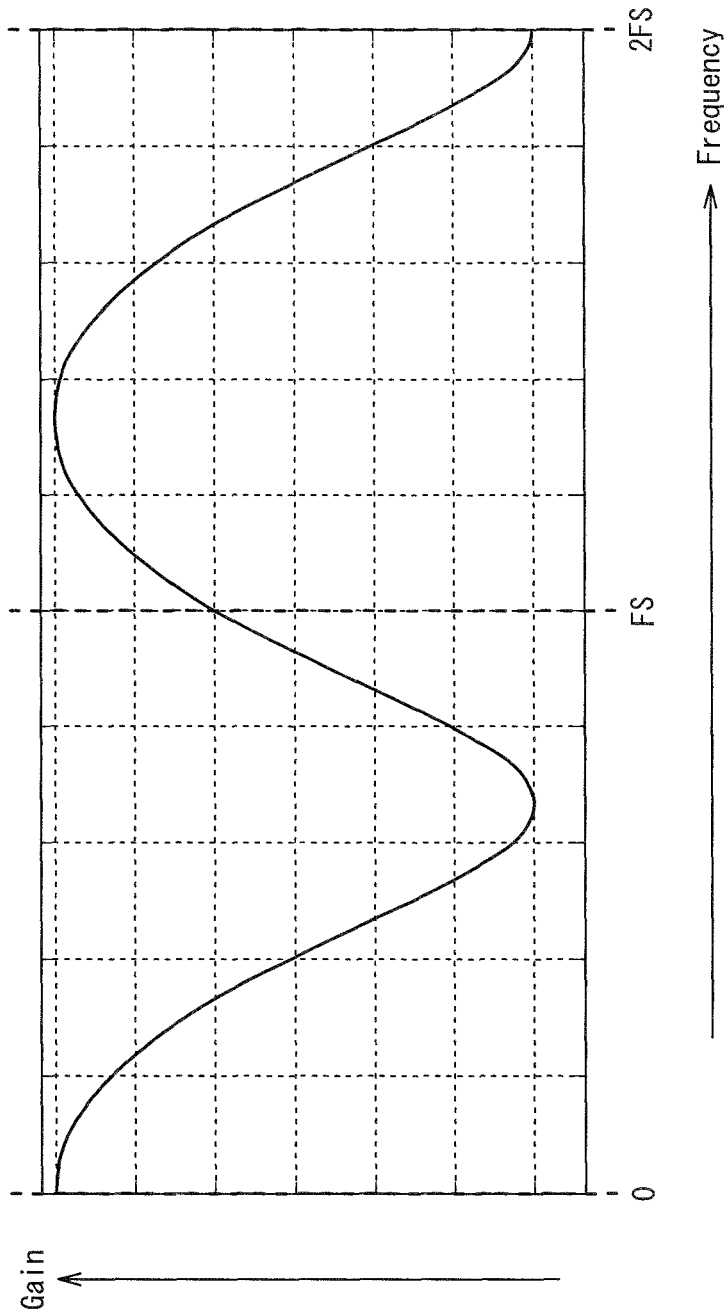
FIG. 25 is a view illustrating a frequency characteristic in a case where capacitance ratios between sampling capacitors are changed in a sampling circuit having an analog FIR characteristic illustrated in FIG. 21.

FIG. 25 is a view illustrating the frequency characteristic in a case where the capacitance ratios between the sampling capacitors are changed in the sampling circuit having the analog FIR characteristic illustrated in FIG. 21. The frequency characteristic illustrated in FIG. 25 is obtained in a case where the capacitance ratios between the sampling capacitors of the D/A converter 11 illustrated in FIG. 17 are set as the sampling capacitor 105A_1:the sampling capacitor 105A_2=3:1, the sampling capacitor 105B_1:the sampling capacitor 105B_2=3:1, and the sampling capacitor 105C_1:the sampling capacitor 105C_2=3:1, and the clock signals illustrated in timing charts of FIGS. 20A to 20I are supplied to the sampling capacitors 105A_1, 105A_2, 105B_1, 105B_2, 105C_1, and 105C_2.

FIG. 25 represents the frequency in abscissa and the gain in ordinate. As illustrated in FIG. 25, the gain changes sinusoidally as the frequency increases, reaches a minimum near a frequency relatively lower than the sampling frequency FS and near the frequency 2FS being double of the sampling frequency FS, and reaches a maximum at frequency zero and near a frequency relatively higher than the sampling frequency FS.

In this way, in the analog FIR filer obtained by the D/A converter 11 according to the fourth embodiment, the frequencies in which the zero points are formed depends on intervals of the sampling timings of sampling the analog reference voltages VREF.

That is, when the intervals of the sampling timings of sampling the analog reference voltages VREFH, VREFL in the sampling capacitors are narrow (i.e. short in the time axis), the zero point is formed in the high frequency side, as illustrated in FIG. 23. Herein, "the intervals of the sampling timings is narrow" means that the interval between the falling edges of the clock signal ΦS1A and the clock signal ΦS2A, the interval between the falling edges of the clock signal ΦS1B and the clock signal ΦS2B, or the interval between the falling edges of the clock signal ΦS1C and the clock signal ΦS2C is shorter than the interval between the falling edges of the clock signal ΦS1A and the clock signal ΦS2A, the interval between the falling edges of the clock signal ΦS1B and the clock signal ΦS2B, or the interval between the falling edges of the clock signal ΦS1C and the clock signal ΦS2C illustrated in the timing charts of FIGS. 18A to 18I, as illustrated in the timing charts of FIGS. 22A to 22I.

Conversely, when the intervals of the sampling timings of sampling the analog reference voltages VREFH, VREFL in the sampling capacitors are wide (i.e. long in the time axis), the zero point is formed in the low frequency side, as illustrated in FIG. 21. Herein, "the intervals of the sampling timings is wide" means that the interval between the falling edges of the clock signal ΦS1A and the clock signal ΦS2A, the interval between the falling edges of the clock signal ΦS1B and the clock signal ΦS2B, or the interval between the falling edges of the clock signal ΦS1C and the clock signal ΦS2C is longer than the interval between the falling edges of the clock signal ΦS1A and the clock signal ΦS2A, the interval between the falling edges of the clock signal ΦS1B and the clock signal ΦS2B, or the interval between the falling edges of the clock signal ΦS1C and the clock signal ΦS2C illustrated in the timing charts of FIGS. 18A to 18I, as illustrated in the timing charts of FIGS. 20A to 20I.

It is to be noted that the sampling periods, the integrate timings and the periods thereof do not affect on the analog FIR characteristic of the sampling circuit 22. The analog FIR characteristic is affected by the sampling intervals.

Furthermore, in the four embodiment, the conventional sampling capacitor 905 illustrated in FIG. 26 is divided into the plural capacitors, and three sets (i.e. triple of conventional ones) of circuits using plural sampling timings are provided, as illustrated in FIG. 17. Then, in the fourth embodiments, by causing the divided sampling capacitors to perform the time-interleave operation, it is possible to perform sampling within all of the phases, instead of dividing the sampling capacitor in only the sampling phase to perform sampling in half of the phases. Therefore, in the fourth embodiment, it is possible to set the intervals of sampling timings of sampling the analog reference voltages VREFH, VREFL in the sampling capacitors to be wide (long in the time axis). Therefore, in the fourth embodiment, it is possible to form the zero point in a low frequency range and to form the cut off point in the low frequency range.

In the case where sixteen sampling capacitors is provided in the fourth embodiment, for example, it is possible to obtain the analog FIR characteristic illustrated in FIG. 4. Furthermore, in the fourth embodiment, it is possible to arbitrarily adjust the analog FIR characteristic as illustrated in FIG. 19, FIG. 21, FIG. 23, FIG. 24, and FIG. 25, by adjusting the sampling timings of the sampling capacitors and the capacitance ratios between the sampling capacitors.

Therefore, in the fourth embodiment, it is possible to suppress the high-frequency component, such as a frequency component higher than the half of the sampling frequency of the sampling circuit 22. That is, in the fourth embodiment, it is possible to provide the sampling circuit 22 having a frequency characteristic resulting in the effect of suppressing the high-frequency component.

Furthermore, the D/A converter 11 illustrated in FIG. 17 includes the circuit having elements reference numerals of which are given "A", the circuit having elements reference numerals of which are given "B", and the circuit having elements reference numerals of which are given "C", and causes the sampling capacitors included in the three sets of circuits to perform the sampling operations in a given order. As a result, in the D/A converter 11, while one set of circuits (e.g. the circuit having elements reference numerals of which are given "B") transfers the charge to the integral capacity element 106, the other two sets of circuits (e.g. the circuits having elements reference numerals of which are given "A" and "C") perform the sampling operations in parallel with the transferring, as illustrated in FIGS. 18A to 18I.

Therefore, in the fourth embodiment, the circuit having elements reference numerals of which are given "A", for example, only has to perform the sampling operation while the charges are transferred by the clock signal ΦIB and the clock signal ΦIC, as illustrated in FIGS. 18A to 18Q. For this reason, the D/A converter 11 can obtain twice the sampling period of the conventional D/A converter. Thus, it is possible to increase the degrees of freedom in setting of the sampling timing, i.e., the degrees of freedom in setting of the analog FIR filter characteristic.

Furthermore, in the fourth embodiment, the sampling capacitor is divided into the plural capacitors, and the three sets (i.e. triple of conventional ones) of circuits using plural sampling timings are provided. Therefore, in the D/A converter 11 illustrated in FIG. 17, any one set of the three sets can always transfer the charge. Thus, it is possible to double the generation timings of the output signal as compared with the conventional D/A converter. That is, conventionally, it is necessary to double the frequency of the clock signal in order to double the output generation timings. In the fourth embodiment, it is possible to double the output generation timings without doubling the clock frequency.

Then, the fourth embodiment does not change the clock frequency, and thus does not result in the increase in the consumed power. The doubled generation timings of the output signal means a doubled signal band of the output signal. Accordingly, in the fourth embodiment, the influence of the thermal noise produced in the sampling circuit 22 is reduced to half. Thus, it is possible to reduce the capacitance of the sampling capacitance which is a major cause of the thermal noise to half of the conventional one, when an S/N performance equivalent to the conventional one is required.

Furthermore, in the fourth embodiment, even the three sets of the sampling capacitor is provided, which might result in the circuit size (area) increased three times, it is possible to reduce the capacitance of the sampling capacitor per one set to half. Therefore, the area is increased only 1.5 times (0.5*3). Thus, it is possible to suppress the increase in the area.

Furthermore, in the fourth embodiment, there are the plural sampling timings. Thus, it is possible to diffuse the radiation noise due to the inrush current in the analog part to suppress the radiation noise effectively.

Furthermore, in the fourth embodiment, it is possible to give the frequency characteristic of the analog FIR filter to the sampling circuit itself. Therefore, it is unnecessary to provide the additional analog part such as an analog circuit to obtain the frequency characteristic of the analog FIR filter.

Furthermore, in the fourth embodiment, it is possible to obtain the above-mentioned effect with only the increase in the sampling circuit without the increase in the noise or the like.

Furthermore, as mentioned above, in the fourth embodiment, it is possible to suppress the influence of the noise superimposing the analog reference voltages REFH, REFL by adjusting the operating timings or the capacitances of the respective sampling capacitors in the sampling circuit 22. Therefore, in the fourth embodiment, it is possible to provide the D/A converter 11 with the above-mentioned effect without using an advanced process technology or the like.

Furthermore, in the fourth embodiment, it is possible to provide the D/A converter 11 without an increase in a consumption current, the noise or the like, by adjusting the specification of the sampling circuit 22. Thus, it is possible to suppress the obstruction by employing the sampling circuit 22, of the downsizing of the electronic equipment on which the D/A converter 11 is mounted.

It is to be noted that there is described in the fourth embodiment the case where the digital code is one-bit value (i.e. one bit). However, the fourth embodiment is not limited to the case the digital code is one-bit value, when the digital code issued from the digital circuit 201 is a K-valued code (K bits, K is a natural number ≤M), it is possible to suppress the increase in the capacitance of the sampling capacitors by inputting the K values to the respective sampling capacitor groups each including M/K sampling capacitors. Such a configuration corresponds to using the plural digital codes as is in the CAP division in a multi-bit D/A converter.

In this way, according to the fourth embodiment of the present invention, it is possible to provide the D/A converter 11 capable of suppressing the high frequency component in the input signal. Then, it is possible to provide such a D/A converter 11 by providing the plural sampling capacitors in the D/A converter and by operating the sampling capacitors on the basis of the two or more different operation timings. Therefore, the D/A converter 11 according to the fourth embodiment does not involve the increase in the consumed power and the increase in the noise as compared to the conventional D/A converter. Furthermore, the D/A converter 11 according to the fourth embodiment can diffuse the radiation noise due to the inrush current in the analog part to suppress the radiation noise effectively.

It is to be noted that the technical scope of the present invention is not limited to the exemplary embodiment illustrated and described above, and includes all embodiments resulting in effects equivalent to those intended by the present invention.

Furthermore, the technical scope of the present invention is not limited to the combination of aspects of the invention claimed in the appended claims, and maybe attained by some of various desired combinations of specific aspects among all disclosed aspects.

According to the embodiments of the present invention, it is possible to provide a D/A converter capable of suppressing a high-frequency component in an input signal. Furthermore, according to the embodiment of the present invention, the high-frequency component in the input signal is suppressed without increase in power consumption and without increase in the noise. Furthermore, according to the embodiment of the present invention, it is possible to diffuse the radiation noise due to the inrush current in the analog part. Thus, the radiation noise can be suppressed effectively.

INDUSTRIAL APPLICABILITY

This disclosure relates to a D/A converter including a sampling circuit capable of suppressing a high frequency component in an input signal without obstructing downsizing of electronic equipment, and can be generally applied to the electronic equipment having a D/A conversion function.

REFERENCE SIGNS LIST

1, 3, 11 D/A converter
2, 4, 22 sampling circuit
101A_1, 101A_2, 101B_1, 101B_2, 101C_1, 101C_2, 102A_1, 102A_2, 102B_1, 102B_2, 102C_1, 102C_2, 103A_1, 103A_2, 103B_1, 103B_2, 103C_1, 103C_2, 104A_1, 104A_2, 104B_1, 104B_2, 104C_1, and 104C_2, 901 to 904 switch
103A, 103B, 103C, 104A, 104B, 104C switch unit
105A, 105B, 105C capacitative element unit
105A_1, 105A_2, 105B_1, 105B_2, 105C_1, 105C_2, 905 sampling capacitor
106 integral capacity element
107 operational amplifier
111 input terminal
112 output terminal
113, 114 terminal
159, 959 controlling circuit
201 digital circuit
202A switch circuit
1001 analog prefilter
1002 D/A converter 1401, 1402 switch and the second switch unit operate alternately.

The invention claimed is:

1. A D/A converter comprising:
a first capacitative element unit including a plurality of capacitative elements configured to store a first charge depending on a reference voltage corresponding to a first digital code;
a first switching element unit including a plurality of switching elements configured to store the first charge in the plurality of capacitative elements of the first capacitative element unit, respectively, and to transfer the first charge;
a second capacitative element unit including a plurality of capacitative elements configured to store a second charge depending on a reference voltage corresponding to a second digital code;
a second switching element unit including a plurality of switching elements configured to store the second charge in the plurality of capacitative elements of the second capacitative element unit, respectively, and to transfer the second charge;
an integral capacity element to which the first and the second charges stored in the first capacitative element unit and the second capacitative element unit are transferred; and
an operational amplifier connected to the first switching element unit and the second switching element unit, wherein
the first switching element unit is configured to store the first charge in the plurality of capacitative elements of the first capacitative element unit at different sampling timings for the plurality of capacitative elements of the first capacitative element unit, the different sampling timings being within a time interval after a previous transferring of the first charge stored in the first capacitative element unit to the integral capacity element and before a subsequent transferring of the first charge stored in the first capacitative element unit to the integral capacity element, and
the second switching element unit is configured to store the second charge in the plurality of capacitative elements of the second capacitative element unit at different sampling timings for the plurality of capacitative elements of the second capacitative element unit, the different sampling timings being within a time interval after a previous transferring of the second charge stored in the second capacitative element unit to the integral capacity element and before a subsequent transferring of the second charge stored in the second capacitative element unit to the integral capacity element.

2. The D/A converter according to claim 1, wherein
the first switching element unit is configured to store the first charge in the plurality of capacitative elements of the first capacitative element unit while the second switching element unit stops storing the second charge, and
the second switching element unit is configured to store the second charge in the plurality of capacitative elements of the second capacitative element unit while the first switching element unit stops storing the first charge.

3. The D/A converter according to claim 1, wherein the first switching element unit and the second switching element unit are configured to operate alternately.

4. The D/A converter according to claim 1, wherein the first switching element unit and the second switching element unit are configured to operate in turn.

5. A D/A converter comprising:
a first capacitative element unit including a plurality of capacitative elements configured to store a first charge depending on a reference voltage corresponding to a first digital code;
a first switching element unit including a plurality of switching elements configured to store the first charge in the plurality of capacitative elements of the first capacitative element unit, respectively, and to transfer the first charge;
a second capacitative element unit including a plurality of capacitative elements configured to store a second charge depending on a reference voltage corresponding to a second digital code;
a second switching element unit including a plurality of switching elements configured to store the second charge in the plurality of capacitative elements of the second capacitative element unit, respectively, and to transfer the second charge;
a third capacitative element unit including a plurality of capacitative elements configured to store a third charge depending on a reference voltage corresponding to a third digital code;
a third switching element unit including a plurality of switching elements configured to store the third charge in the plurality of capacitative elements of the third capacitative element unit, respectively, and to transfer the third charge;
an integral capacity element to which the first charge, the second charge, and the third charge stored in the first capacitative element unit, the second capacitative element unit, and the third capacitive element, respectively, are transferred; and
an operational amplifier connected to the first switching element unit, the second switching element unit, and the third switching element unit;
wherein the first switching element unit is configured to store the first charge in the plurality of capacitative elements of the first capacitative element unit in accordance with a plurality of clock signals which are set such that sampling timings are different for the plurality of capacitative elements of the first capacitative element unit,
the second switching element unit is configured to store the second charge in the plurality of capacitative elements of the second capacitative element unit in accordance with a plurality of clock signals which are set such that sampling timings are different for the plurality of capacitative elements of the second capacitative element unit, and
the third switching element unit is configured to store the third charge in the plurality of capacitative elements of the third capacitative element unit in accordance with a plurality of clock signals which are set such that sampling timings are different for the plurality of capacitative elements of the third capacitative element unit.

6. The D/A converter according to claim 5, wherein the first switching element unit is configured to store the first charge in the plurality of capacitative elements of the first capacitative element unit while the second switching element unit transfers the second charge stored in the plurality of capacitative elements of the second capacitative element unit and while the third switching element unit transfers the third charge stored in the plurality of capacitative elements of the third capacitative element unit,
the second switching element unit is configured to store the second charge in the plurality of capacitative elements of the second capacitative element unit while the first switching element unit transfers the first charge stored in the plurality of capacitative elements of the first capacitative element unit and while the third switching element unit transfers the third charge stored in the plurality of capacitative elements of the third capacitative element unit, and
the third switching element unit is configured to store the third charge in the plurality of capacitative elements of the third capacitative element unit while the first switching element unit transfers the first charge stored in the plurality of capacitative elements of the first capacitative element unit and while the second switching element unit transfers the second charge stored in the plurality of capacitative elements of the second capacitative element unit.

7. The D/A converter according to claim 5, wherein a first period when the first charge stored in the first capacitative element unit is transferred, a second period when the second charge stored in the second capacitative element unit is transferred, and a third period when the third charge stored in the third capacitative element unit is transferred are switched in a predetermined order.

8. The D/A converter according to claim 7 wherein any one of the first charge stored in the first capacitative element unit, the second charge stored in the second capacitative element unit, and the third charge stored in the third capacitative element unit is always transferred.

9. The D/A converter according to claim 5, wherein the first switching element unit, the second switching element unit and the third switching element unit are configured to operate in a predetermined order.

10. The D/A converter according to claim 5, wherein the first switching element unit, the second switching element unit and the third switching element unit are configured to operate in turn.

11. The D/A converter according to claim 1, wherein the different sampling timings for the plurality of capacitative elements of the first capacitative element unit and the plurality of capacitative elements of the second capacitative element unit are determined based on a plurality of clock signals, and jitters are added to falling edges of the plurality of clock signals.

12. The D/A converter according to claim 1, wherein the different sampling timings for the plurality of capacitative elements of the first capacitative element unit and the plurality of capacitative elements of the second capacitative element unit are determined based on a plurality of clock signals, and jitters are added to rising edges of the plurality of clock signals.

13. The D/A converter according to claim 1, wherein
the first switching element unit is configured to transfer the first charge stored in the first switching element unit to the integral capacity element at a first timing, and
the second switching element unit is configured to transfer the second charge stored in the second switching element unit to the integral capacity element at a second timing different from the first timing.

* * * * *